(12) United States Patent
Singh et al.

(10) Patent No.: US 9,257,295 B2
(45) Date of Patent: Feb. 9, 2016

(54) ION BEAM ETCHING SYSTEM

(71) Applicant: LAM Research Corporation, Fremont, CA (US)

(72) Inventors: Harmeet Singh, Fremont, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/637,260

(22) Filed: Mar. 3, 2015

(65) Prior Publication Data

US 2015/0179465 A1    Jun. 25, 2015

Related U.S. Application Data

(62) Division of application No. 13/936,930, filed on Jul. 8, 2013, now Pat. No. 9,017,526.

(51) Int. Cl.
*H01L 21/3065* (2006.01)
*H01L 21/67* (2006.01)
(Continued)

(52) U.S. Cl.
CPC ......... *H01L 21/3065* (2013.01); *H01J 37/3244* (2013.01); *H01J 37/32422* (2013.01); *H01J 37/32458* (2013.01); *H01J 37/32623* (2013.01);
(Continued)

(58) Field of Classification Search
CPC .............. H01L 21/3065; H01L 21/31116; H01L 21/32136; H01L 21/67069; H01L 21/67213; H01J 37/3244; H01J 34/32458; H01J 37/32623; H01J 2237/3341
See application file for complete search history.

(56) References Cited

U.S. PATENT DOCUMENTS 4,600,464 A    7/1986  Desilets et al.
6,007,673 A    12/1999 Kugo et al.
(Continued)

FOREIGN PATENT DOCUMENTS

CN    102834905 A    12/2012
JP    H07235397 A    9/1995
(Continued)

OTHER PUBLICATIONS

U.S. Patent Application entitled "Ion to Neutral Control for Wafer Processing with Dual Plasma Source Reactor," Dhindsa et al., U.S. Appl. No. 14/033,241, filed Sep. 20, 2013.
(Continued)

*Primary Examiner* — Duy Deo
(74) *Attorney, Agent, or Firm* — Weaver Austin Villeneuve & Sampson LLP

(57) ABSTRACT

The disclosed embodiments relate to methods and apparatus for removing material from a substrate. In various implementations, conductive material is removed from a sidewall of a previously etched feature such as a trench, hole or pillar on a semiconductor substrate. In practicing the techniques herein, a substrate is provided in a reaction chamber that is divided into an upper plasma generation chamber and a lower processing chamber by a corrugated ion extractor plate with apertures therethrough. The extractor plate is corrugated such that the plasma sheath follows the shape of the extractor plate, such that ions enter the lower processing chamber at an angle relative to the substrate. As such, during processing, ions are able to penetrate into previously etched features and strike the substrate on the sidewalls of such features. Through this mechanism, the material on the sidewalls of the features may be removed.

20 Claims, 11 Drawing Sheets

(51) Int. Cl.
*H01J 37/32* (2006.01)
*H01L 21/311* (2006.01)
*H01L 21/3213* (2006.01)
*H01L 21/02* (2006.01)
*H01L 43/12* (2006.01)

(52) U.S. Cl.
CPC .... *H01L 21/31116* (2013.01); *H01L 21/32136* (2013.01); *H01L 21/67069* (2013.01); *H01L 21/67213* (2013.01); *H01J 37/32* (2013.01); *H01J 2237/327* (2013.01); *H01J 2237/3341* (2013.01); *H01L 21/02057* (2013.01); *H01L 43/12* (2013.01)

(56) References Cited

U.S. PATENT DOCUMENTS

| | | | |
|---|---|---|---|
| 6,013,580 | A | 1/2000 | Yanagida |
| 6,101,970 | A | 8/2000 | Koshimizu |
| 6,162,323 | A | 12/2000 | Koshimizu |
| 6,689,283 | B2 | 2/2004 | Hattori et al. |
| 6,851,384 | B2 | 2/2005 | Yuda et al. |
| 7,244,474 | B2 | 7/2007 | Hanawa et al. |
| 7,291,360 | B2 | 11/2007 | Hanawa et al. |
| 7,520,999 | B2 | 4/2009 | Chandrachood et al. |
| RE40,951 | E | 11/2009 | Kodaira et al. |
| 7,695,590 | B2 | 4/2010 | Hanawa et al. |
| 7,767,561 | B2 | 8/2010 | Hanawa et al. |
| 7,909,961 | B2 | 3/2011 | Kumar et al. |
| 8,058,156 | B2 | 11/2011 | Hanawa et al. |
| 8,349,128 | B2 | 1/2013 | Todorow et al. |
| 8,356,575 | B2 | 1/2013 | Sasaki et al. |
| 9,017,526 | B2 * | 4/2015 | Singh ................ H01J 37/32422 156/345.1 |
| 2002/0179248 | A1 | 12/2002 | Kabansky |
| 2003/0227258 | A1 * | 12/2003 | Strang ................ H01J 37/32449 315/111.21 |
| 2004/0014325 | A1 | 1/2004 | Laermer et al. |
| 2004/0221958 | A1 | 11/2004 | Loewenhardt et al. |
| 2005/0025791 | A1 | 2/2005 | Remenar et al. |
| 2005/0211171 | A1 | 9/2005 | Hanawa et al. |
| 2005/0211546 | A1 | 9/2005 | Hanawa et al. |
| 2005/0211547 | A1 | 9/2005 | Hanawa et al. |
| 2005/0287811 | A1 | 12/2005 | Inukai |
| 2006/0000805 | A1 | 1/2006 | Todorow et al. |
| 2006/0021701 | A1 | 2/2006 | Tobe et al. |
| 2006/0102286 | A1 | 5/2006 | Kim |
| 2007/0000611 | A1 | 1/2007 | Shannon et al. |
| 2007/0017898 | A1 | 1/2007 | Kumar et al. |
| 2007/0068624 | A1 | 3/2007 | Jeon et al. |
| 2007/0247073 | A1 | 10/2007 | Paterson et al. |
| 2008/0178805 | A1 | 7/2008 | Paterson et al. |
| 2011/0151673 | A1 * | 6/2011 | Noda ................ B82Y 20/00 438/712 |
| 2011/0177694 | A1 | 7/2011 | Chen et al. |
| 2012/0031559 | A1 | 2/2012 | Dhindsa et al. |
| 2012/0034786 | A1 | 2/2012 | Dhindsa et al. |
| 2012/0104274 | A1 | 5/2012 | Hirayanagi et al. |
| 2012/0273130 | A1 | 11/2012 | Drewery et al. |
| 2012/0322011 | A1 | 12/2012 | Wu et al. |
| 2013/0059448 | A1 | 3/2013 | Marakhtanov et al. |
| 2014/0054269 | A1 | 2/2014 | Hudson et al. |
| 2014/0251790 | A1 | 9/2014 | Kodaira et al. |
| 2014/0302678 | A1 | 10/2014 | Paterson et al. |
| 2014/0302680 | A1 | 10/2014 | Singh et al. |
| 2014/0302681 | A1 | 10/2014 | Paterson et al. |
| 2015/0011093 | A1 | 1/2015 | Singh et al. |
| 2015/0017810 | A1 | 1/2015 | Guha |

FOREIGN PATENT DOCUMENTS

| | | |
|---|---|---|
| JP | 2604684 B2 | 4/1997 |
| JP | 2012531520 A | 12/2012 |

OTHER PUBLICATIONS

US Office Action, dated Jan. 14, 2015, issued in U.S. Appl. No. 13/916,318.
US Office Action, dated Feb. 10, 2015, issued in U.S. Appl. No. 13/939,709.
US Notice of Allowance, dated Jan. 16, 2015, issued in U.S. Appl. No. 13/936,930.
US Office Action, dated Oct. 11, 2013, issued in U.S. Appl. No. 13/626,793.
US Final Office Action, dated Feb. 13, 2014, issued in U.S. Appl. No. 13/626,793.
US Office Action, dated Jul. 16, 2014, issued in U.S. Appl. No. 13/626,793.
US Notice of Allowance, dated Jan. 2, 2015, issued in U.S. Appl. No. 13/626,793.
US Office Action, dated May 21, 2014, issued in U.S. Appl. No. 13/227,404.
Suda et al., (2012) "Development of Cu Etching Using $O_2$ Cluster Ion Beam under Acetic Acid Gas Atmosphere", *Japanese Journal of Applied Physics*, 51:08HA02-1-08HA02-5.
Wolf, S. and R.N. Tauber, R.N. (2000) "Silicon Processing for the VLSI Era," Chapter 14, Dry Etching for Ulsi Fabrication, *Lattice Press*, ISBN 0-9616721-6-1, 1:673-676.
Xiao, (2001) "Introduction to Semiconductor Manufacturing Technology", *Published by Prentice Hall*, ISBN 0-13-022404-9, Chapter 7, p. 230.

* cited by examiner

ION BEAM ETCHING SYSTEM

CROSS-REFERENCE TO RELATED APPLICATIONS

This application is a divisional of U.S. patent application Ser. No. 13/936,930, filed Jul. 8, 2013, and titled "ION BEAM ETCHING SYSTEM," which is herein incorporated by reference in its entirety and for all purposes.

BACKGROUND

One operation frequently employed in the production of semiconductors is an etching operation. In an etching operation, one or more materials are partly or wholly removed from a partially fabricated integrated circuit. Plasma etching is often used, especially where the geometries involved are small, high aspect ratios are used, or precise pattern transfer is needed.

With the move from planar to 3D transistor structures (e.g., FinFET gate structures for logic devices) and advanced memory structures such as Magnetoresistive Random Access Memory (MRAM) and Resistive Random Access Memory (ReRAM), plasma etching processes need to be increasingly precise and uniform in order to produce quality products. One problem with conventional etching techniques is that etching byproducts, instead of being swept away, are sometimes re-deposited on surfaces where such deposition is not desired. For example, the byproducts may deposit back on the substrate, especially on the sidewalls of features. The byproducts are often metallic or metal rich films. This redeposition phenomenon, and the related problem of incomplete or non-vertical sidewall etching, is particularly problematic when etching non-volatile substances, which is often the case when fabricating advanced devices such as MRAM, ReRAM, cross point memory devices, etc. These etching processes may be dominated by sputtering from ions, a method which typically results in some amount of redeposition on the feature sidewalls.

Unwanted etching byproduct deposition on the substrate can cause many problems including poor etch results and sub-standard devices. For example, the deposition may result in a non-vertical etching profile or other etching non-uniformities. Further, the deposition may cause electrical problems, especially where the structure being etched has interleaving layers dielectric and conductive films. In some cases, unwanted metallic material may deposit on the sidewall of an etched stack, thereby forming an electrical connection between layers that are supposed to be electrically insulated. This connection creates a short circuit in the stack and may result in failure of the device. One example of this type of failure is a short that forms across a magnetic tunnel junction (MTJ) barrier of an MRAM device.

Thus, there exists a need for improved semiconductor fabrication methods and apparatus which permit the removal of unwanted material from a semiconductor substrate (especially material on a side wall of an etched feature) after the substrate has been etched.

SUMMARY

Certain embodiments herein relate to methods and apparatus for removing unwanted material from a substrate after etching. In various embodiments, the substrate is a partially fabricated semiconductor substrate, and the unwanted material includes metallic deposits on the sidewall of an etched feature. The material may be removed by using angled ion beams to sputter remove the unwanted metallic deposits from feature sidewalls. The angled ion beams may be achieved by using a corrugated ion extractor plate which permits ions to enter a substrate processing chamber at various angles relative to the surface of the substrate.

In one aspect of the embodiments herein, a method is provided for removing material from sidewalls of features in semiconductor device structures, including (a) receiving a substrate in a reaction chamber, where the reaction chamber is divided into a plasma generation sub-chamber and a processing sub-chamber by an ion extractor plate, where the ion extractor plate is at least partially corrugated and has apertures designed or configured to direct the passage of ions therethough at a plurality of angles with respect to the substrate; (b) flowing a plasma generating gas into and generating a plasma in the plasma generation sub-chamber; and (c) accelerating ions from the plasma generation sub-chamber, through the ion extractor plate, and into the processing volume toward the substrate at a plurality of angles to thereby remove material from feature sidewalls facing a plurality of directions.

In some cases, the features of the semiconductor device structure include an etched insulating layer positioned between two etched conductive layers. The feature may be a trench, hole, or pillar in various implementations. At least some of the apertures will typically have a central axis that is oriented at a non-perpendicular angle relative to the substrate. In some embodiments, there is substantially no plasma present in the processing sub-chamber. In other words, the processing sub-chamber may be substantially free of plasma.

In some implementations, the method further includes rotating the ion extractor plate during processing, but less than or equal to 360° in a single direction. The ion extractor plate may also be rotated to an extent at which local parts of the substrate are exposed to ions originating from each of a plurality of distinct segment types. In some embodiments, the ion extractor plate moves along an axis extending through the center of the extractor plate and substrate. The rotation and/or translation may occur during a single etching operation, between different steps in a multi-step etch process, or between processing different substrates. In these or other embodiments, the substrate holder may be stationary during processing. In various implementations, the method also includes etching the features in the substrate prior to operation (a). In these cases, the method may also include moving the substrate from an apparatus where the etching is performed to the reaction chamber prior to (a). Further, in some embodiments, the method includes applying a bias to the ion extractor plate.

In another aspect of the embodiments herein, an apparatus is provided for removing material from sidewalls of features on a semiconductor substrate surface, including (a) a reaction chamber; (b) an ion extractor plate positioned in the reaction chamber, thereby dividing the reaction chamber in to a plasma generation sub-chamber and a processing sub-chamber, where at least part of the ion extractor plate is corrugated, and where the ion extractor plate has apertures designed or configured to permit the passage of ions therethrough; (c) one or more gas inlets to the plasma generation sub-chamber; (d) one or more gas outlets to the reaction chamber; (e) a plasma generation source designed or configured to produce a plasma in the plasma generation sub-chamber; and (f) a substrate support.

The apparatus may also include a controller. In some cases the controller is designed or configured generate a plasma in the plasma generation sub-chamber, apply a bias to the ion extractor plate, and rotate the ion extractor plate by less than or equal to about 360° as measured in a single direction. The controller may also be designed or configured to rotate the ion extractor plate clockwise and counterclockwise while removing material from the sidewalls of the features of the substrate.

The apparatus may also include RF straps connecting the ion extractor plate with the substrate support, where the RF straps are designed or configured to provide a bias on the substrate support that corresponds to the bias applied to the ion extractor plate. In various embodiments, axes extending through the centers of the apertures may be oriented normal to the local surfaces of the ion extractor plate where the apertures are positioned, to thereby direct passage of ions in a direction that is generally normal to the local surface of the ion extractor plate. In some cases, at least some of the apertures are cone-shaped, such that when considering a single aperture, an aperture open area on the side of the ion extractor plate facing the processing sub-chamber is larger than an aperture open area on the side of the ion extractor plate facing the plasma generation sub-chamber.

In these or other cases, the corrugated part of the ion extractor plate may include a plurality of cone-shaped features, where the apertures are positioned such that they extend through surfaces of the cone-shaped features that are slanted with respect to the substrate support. The ion extractor plate may also include a plurality of corrugated segments, where the orientation of corrugation is different between adjacent segments. In some implementations, at least two distinct types of corrugated segments are used. A first segment type may be designed or configured to direct ions in a direction radially offset from a direction normal to the processing face of the substrate. A second segment type may be designed or configured to direct ions in a direction azimuthally offset from a direction normal to the processing face of the substrate. In some cases, an angle of corrugation may be between about 1-75°. Further, in some cases at least two angles of corrugation are used.

The direction of ions passing through an aperture may be conically distributed about an axis extending through the center of the aperture. In other cases, the direction of ions is less conically distributed and more collimated. There is a distance between the average position of the ion extractor plate (or the corrugated portion thereof) and the plating face of the substrate when present on a substrate support. In some embodiments, this distance is less than about 10 cm. In various cases, the ion extractor plate is rotatable about an axis extending through the center of the ion extractor plate. The apparatus may also include a translation actuator for moving the ion extractor plate toward and away from the substrate support during processing of the substrate. The translation actuator may also be designed or configured to move the ion extractor plate in a direction parallel to the substrate. In these or other cases, a distance between adjacent corrugation peaks is at least about 2 mm. In some cases, this distance is between about 5-20 mm. In some cases, the patterns of aperture position vary between adjacent corrugation features. The reaction chamber may also be configured to etch a substrate in a vertical direction when the corrugated ion extractor plate is not present, and be configured to etch a substrate in a plurality of angled directions when the corrugated ion extractor plate is present.

These and other features will be described below with reference to the associated drawings.

DETAILED DESCRIPTION

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Further, though the description often refers to "upper" and "lower" elements (or similarly to "top" and "bottom," "left" and "right," etc.) these descriptors are used in a non-limiting fashion, solely for the sake of clarity. One of ordinary skill in the art would understand that other configurations may be used, as well. In certain embodiments, elements which are described herein as "upper" and "lower" may become the "lower" and "upper" or "left" and "right" elements, for example.

The embodiments herein generally deal with semiconductor processing methods and apparatus. More specifically, the embodiments relate to methods and apparatus for removing unwanted material such as metallic deposits from the sidewalls of an etched feature. The disclosed methods are typically practiced after a substrate has been plasma etched. In certain embodiments, the etched feature is a trench or other depression. The method may be practiced in a separate module, or in an etching module that has been appropriately modified (e.g., by adding an ion extractor plate) since the time a previous etching process occurred.

Figure 1:
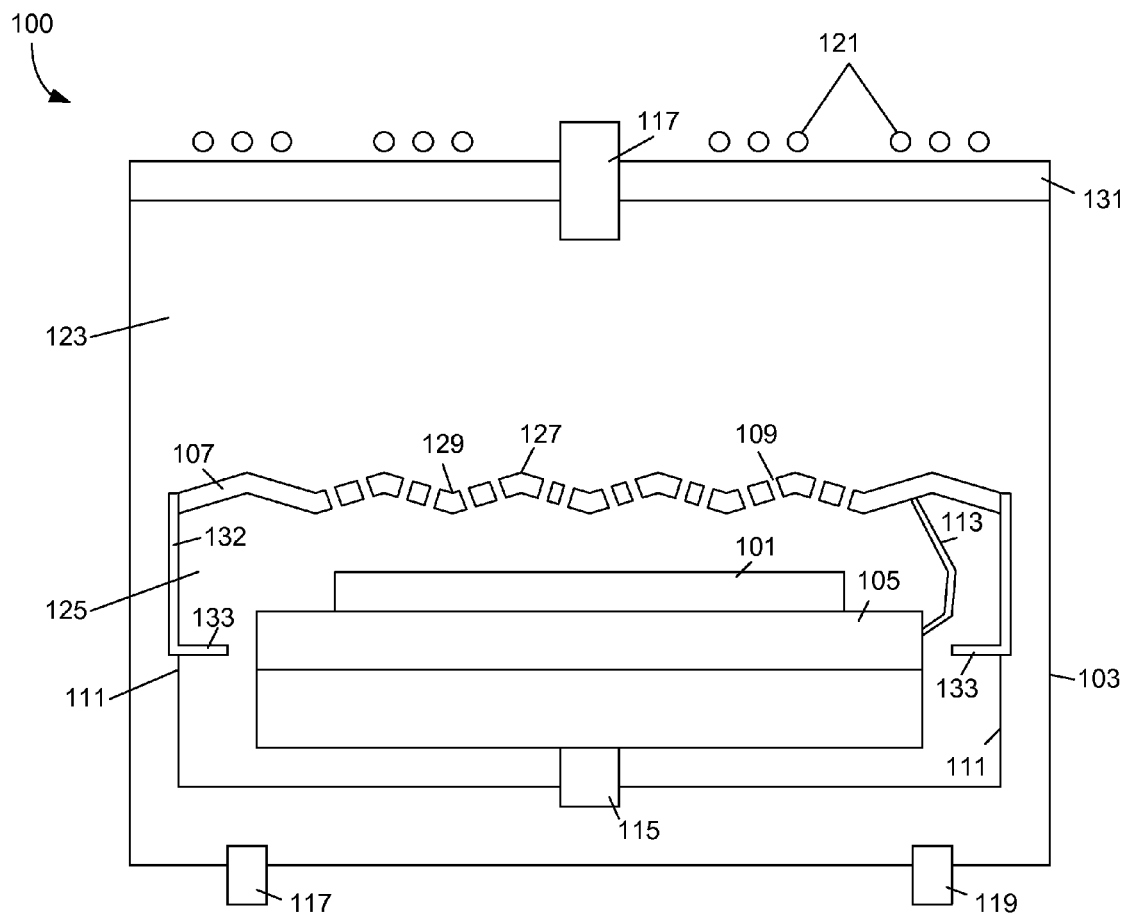
FIG. 1 shows a cross-sectional view of an angled plasma etching reactor according to a disclosed embodiment.

In practicing the disclosed techniques, a substrate is provided in a processing chamber. FIG. 1 shows a simplified cross-sectional view of an appropriate processing apparatus 100. The substrate 101 is positioned on a substrate support 105 in reaction chamber 103. In many implementations, the substrate support is fixed (i.e., does not rotate or otherwise move). In certain cases, the substrate support 105 is an electrostatic chuck. An ion extractor plate 107 is positioned above the substrate 101, and is supported by supports 111 connected with the rotational actuator 115. In some embodiments, the ion extractor plate 107 includes an additional cage portion. The cage may include cylindrical sidewalls 132 extending vertically downwards from the ion extractor plate, and a flat annular surface 133 extending inward from the sidewalls 132. The ion extractor plate itself 107 may function as the ceiling of the cage. The sidewalls 132 and flat surface 133 may be conductive, and the support 111 may be non-conductive. In other embodiments, such as the one shown in FIG. 7, this cage structure is not present. The ion extractor plate 107 divides the processing chamber 103 into an upper plasma generation chamber 123 and a lower processing chamber 125. Chambers 123 and 125 are sometimes referred to as the upper sub-chamber and lower sub-chamber, respectively.

The ion extractor plate 107 has a non-planar cross-section (as viewed from the side, as in FIG. 1). In the embodiment of FIG. 1, the cross-section of the ion extractor plate 107 has a series of peaks 127 and valleys 129, which form a corrugated surface.

A few basic units of corrugation will now be defined for clarity. A surface is considered to be the fundamental unit of corrugation. A surface is a continuous portion of a corrugation feature which is bounded by two vertices/edges (e.g., a surface between a crest and a valley). Examples include, but are not limited to, a flat surface of one leg of a triangular/pyramidal structure and the slanted portion (i.e., non-base portion) of a cone. A surface may include many apertures.

A corrugation feature is typically made of a plurality of differently angled/oriented surfaces. A corrugation feature provides a single unit in a potentially repeating group of features that collectively make up a corrugation segment (or potentially the entire corrugation of a plate, where distinct segments are not used). A feature typically includes a vertex (e.g., an apex, nadir, crest or valley) separating two constituent surfaces, which are usually oriented differently from one another when viewed as a cross-section. Examples of corrugation features include a single span from crest-to-crest or valley-to-valley in an accordion-like corrugation pattern, or a single cone, a single pyramid, a single hemisphere, etc. In the case cone- or hemisphere-shaped corrugation features, for example, it is understood that the surface of the corrugation feature may in fact be a single continuous surface. Nonetheless, when viewed as a cross-section, these features can be considered to have a vertex separating two differently oriented surfaces. Cones, pyramids, hemispheres, etc. are all considered distinct types of corrugation features. Another type of distinct corrugation feature is an accordion-shaped feature having alternately upwards and downwards slanting flat surfaces.

Figure 4A:
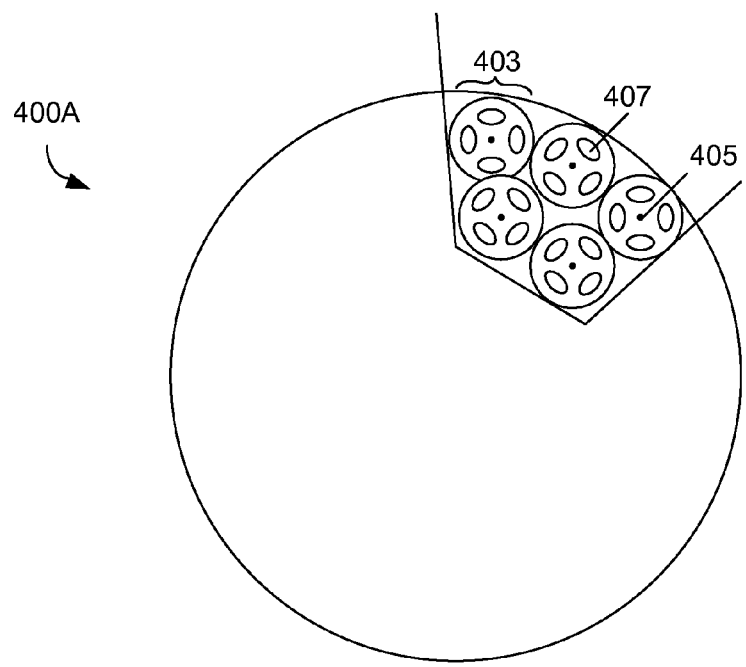
FIGS. 4A-4D illustrate various embodiments of an ion extractor grid in accordance with certain embodiments herein.
Figure 4B:
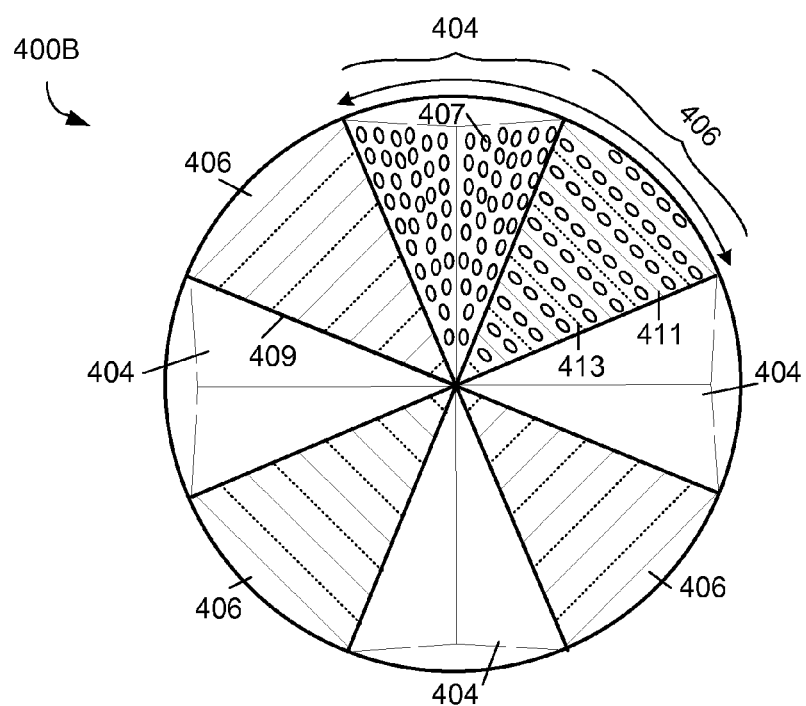

A corrugated segment is a region of an ion extractor plate having a single type of corrugation feature. By way of example, a segment may have (a) only cones, or (b) only hemispheres, or (c) only accordion-shaped features where the vertices (i.e., the crests and valleys) are parallel and aligned in a first direction, or (d) only accordion-shaped features where the vertices are parallel and aligned in a second direction. Referring to FIG. 4A, only a single corrugated segment is present. The segment includes many corrugation features (cones). Referring to FIG. 4B, there are 8 individual corrugated segments, though there are only two distinct types of segments 404 and 406 which alternate. Segment 404 is a single roughly triangular pyramidal-shaped corrugation feature, while segment 406 includes a plurality of accordion-shaped features. These figures will be discussed further below.

As used herein, the term corrugated is used to describe features/segments/plates having portions which alternately slant upwards and downwards, when viewed from the side. An example of a plate that is not considered to be corrugated is one in which there is an outer slanted region or regions around an inner flat region, where the slanted regions all face roughly inwards toward the center of the substrate. In this case the plate would have a trapezoid-shaped cross-sectional portion (when viewed from the side), and is not considered to be corrugated because it does not have surfaces alternately slanting upwards and downwards.

The ion extractor plate 107 has apertures 109 that extend through the thickness of the plate 107. The apertures 109 are oriented such that the axes passing through them are normal to the local surface of the ion extractor plate 107. Because the surface is non-planar, many or all of the apertures 109 may be oriented at angles that are not perpendicular to the plating face of the substrate.

During processing, plasma generation gas enters through gas inlet 117. Any gas or mixture of gas that is used to generate or sustain the plasma may be referred to as a plasma generating gas. Plasma is generated primarily or exclusively in the plasma generation chamber 123 by plasma generating device 121. In the embodiment of FIG. 1, an inductively coupled plasma is generated through the use of coils 121, which are separated from the plasma generation chamber 123 by a dielectric window 131. In various embodiments, the ion extractor plate 107 confines the plasma in the plasma generation chamber 123 such that the processing chamber 125 is substantially free of plasma. In various embodiments, the outer edge of extractor plate 107 and the chamber wall 103 are separated by a distance. This separation distance helps ensure that the extractor plate 107 is properly biased, as explained below.

A bias may be applied to the ion extractor plate 107. RF straps 113 connect the ion extractor plate 107 with the substrate support 105 such that in certain embodiments, the bias applied to the ion extractor plate 107 and the substrate support 105 are equal. Ions present in the plasma generation chamber 123 pass through the apertures 109 in the ion extractor plate 107. Due to the angled orientation of the apertures 109, and the bias applied to the plate 107, the ions are directed into the processing chamber 125 at an angle relative to the substrate 101. The ions contact the surface of the substrate 101 to sputter and thereby remove unwanted materials. Because the ions are traveling at an angle relative to the surface of the substrate, a portion of the ions may travel into the etched features on the substrate such that they sputter remove materials from the sidewalls of the features. In various embodiments, the rotational actuator 115 causes the ion extractor plate 107 to rotate during processing. This rotation exposes etched features to ions directed from a range of angles provided from multiple differently oriented apertures on the ion extractor plate 107. In some cases, a combination of ion sputtering/activation and reactive chemistry may be used to remove the unwanted materials. Reactive chemical etchants may be provided in a process gas introduced to reaction chamber 103, in some cases introduced directly to lower processing chamber 125.

Figure 2A:
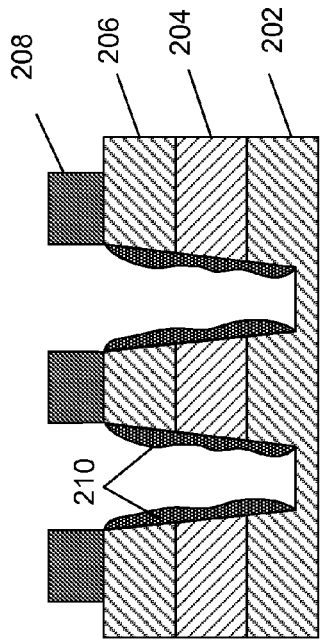
FIGS. 2A-2D show a stack structure of a partially fabricated integrated circuit during various stages of processing.
Figure 2B:
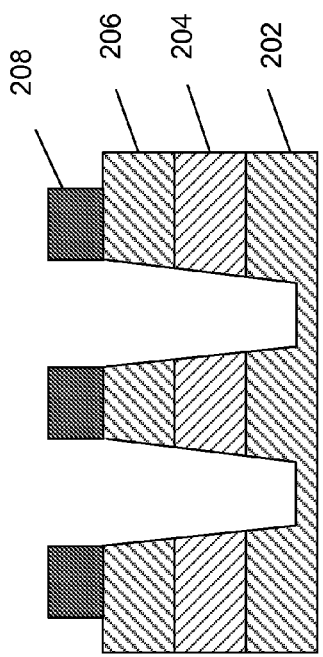

FIGS. 2A-2D illustrate a partially fabricated integrated circuit at different points in a production process according to an embodiment herein. FIG. 2A shows the substrate before it is etched. Here, the substrate has a first layer 202, a second layer 204, a third layer 206, and a patterned mask layer 208. The substrate may be etched according to conventional techniques to yield the etched substrate shown in FIG. 2B. During the etch process, unwanted material 210 may build up on the sidewalls of the etched feature. This unwanted material should be removed to improve the etched feature and reduce the likelihood that the device will fail. Device failure is particularly likely where, for example, the first and third layers 202 and 206 are conductive and the second layer 204 is insulative. Where this is the case, one purpose of insulative layer 204 may be to electrically separate the first and third layers 202 and 206. However, the unwanted material 210, which may be conductive, may form a short between the first and third layers 202 and 206, leading to device failure. Thus, this unwanted material 210 should be removed before further processing.

Figure 2C:
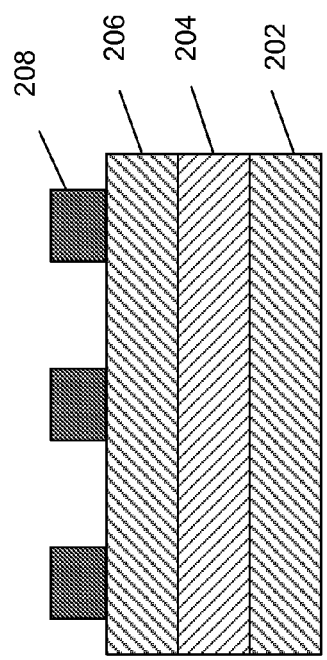
Figure 2D:
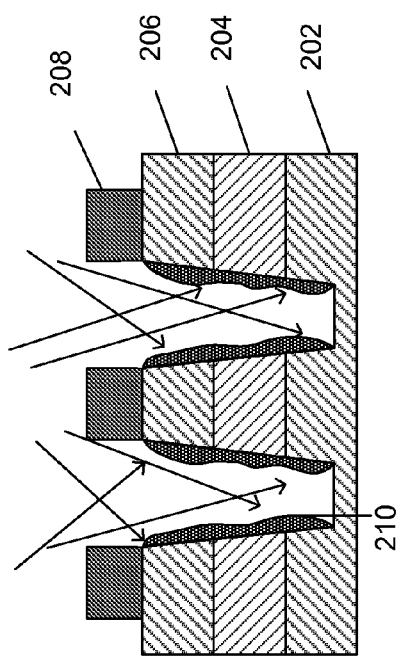

FIG. 2C shows the etched substrate being bombarded by ions according to various embodiments disclosed herein. The trajectory of the ions is shown by the arrows. The ions travel at an angle due to the angled orientation of the apertures 109 on the ion extractor plate 107 shown in FIG. 1. The ions interact with the substrate to sputter the unwanted material 210 off the sidewalls of the features. FIG. 2D shows the substrate after it has been treated according to the disclosed methods. The unwanted material 210 is removed, and the etching profile is improved.

A more detailed example of a plasma reactor that may be used to implement the disclosed techniques is described below with reference to FIG. 7. Examples of plate structures suitable for use as an ion extractor plate are described below with reference to FIGS. 4A-4C, 5A-5D, 6A, and 6B.

Methods

Figure 3A:
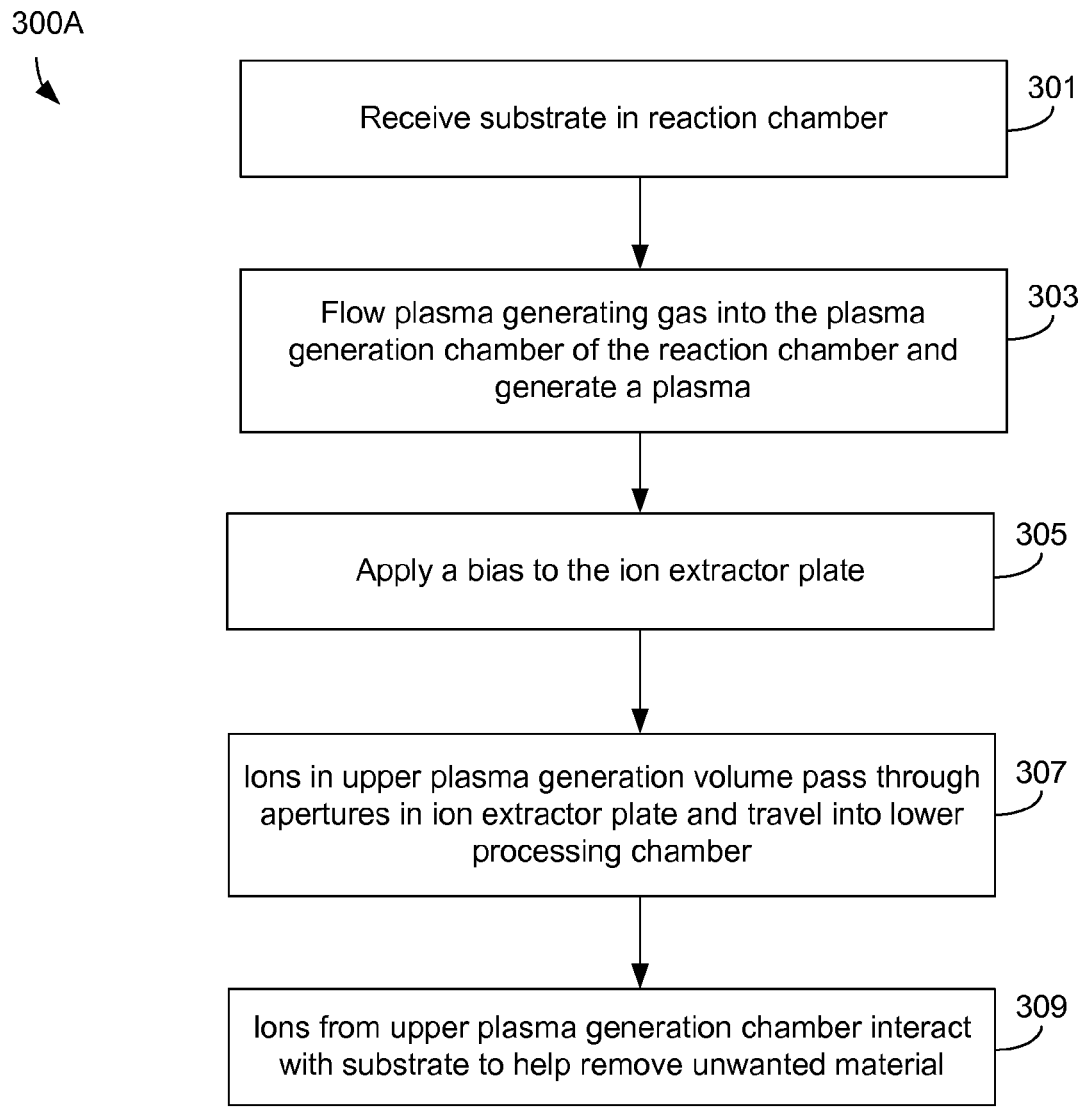
FIG. 3A is a flowchart illustrating a method of practicing the embodiments herein.

FIG. 3A shows a flowchart depicting a process 300A for removing material from a sidewall of a feature in accordance with various disclosed embodiments. In some cases, the feature is a trench that is between about 10-60 nm wide, or between about 5-100 nm wide. In other cases, the feature may be a pillar or hole having a diameter between about 5-100 nm, or between about 10-60 nm. The process 300A begins at block 301, where an etched substrate is received in a reaction chamber. As described above, the reaction chamber is separated by an ion extractor plate into an upper plasma generation chamber and a lower processing chamber. The substrate is provided to the lower processing chamber, and is typically supported by a substrate support such as an electrostatic chuck.

At block 303, plasma generating gas is flowed into the plasma generating chamber. Plasma is generated from the plasma generating gas. At block 305, a bias is applied to the ion extractor plate. In various embodiments, the ion extractor plate is electrically coupled to the electrostatic chuck supporting the substrate. This connection may be made via RF straps constructed from a conductive material. In this way, the substrate may be biased to the same RF potential as the ion extractor plate.

At block 307, ions in the upper plasma generation chamber pass through the apertures in the ion extractor plate and travel into the lower processing chamber such that they may interact with the surface of the substrate at block 309. In many cases, the plasma is confined to the plasma generation chamber and does not leak into the lower processing chamber.

The ions may be accelerated by the applied bias. Many or all of the ions may travel at an angle relative to the face of the substrate. The ions have an angled velocity due to the angled orientation and size of the apertures in the ion extractor grid, as explained elsewhere herein. Because of the ions' angled velocity, many of the ions are able to penetrate into the etched features and strike a sidewall of the feature. Ions that strike the sidewall of an etched feature are able to help remove unwanted material deposited thereon. If the ions' trajectory were vertical rather than angled, the ions that penetrate into an etched feature would likely strike the bottom of the feature, instead of a sidewall. Further, although some ions with a vertical trajectory will strike a sidewall, the high angle of incidence results in a fairly slow removal process. By using angled ion trajectories, ions which penetrate into features will strike the sidewalls with a smaller angle of incidence, resulting in faster removal of the material thereon. In some cases, the ions may sputter remove the unwanted material. In other cases, the ions may activate a surface (e.g., the sidewall of an etched feature), and then reactive chemistry may be used to remove the unwanted material from the activated surface. The unwanted material may be swept out of the reaction chamber through an outlet connected with a vacuum source.

Figure 3B:
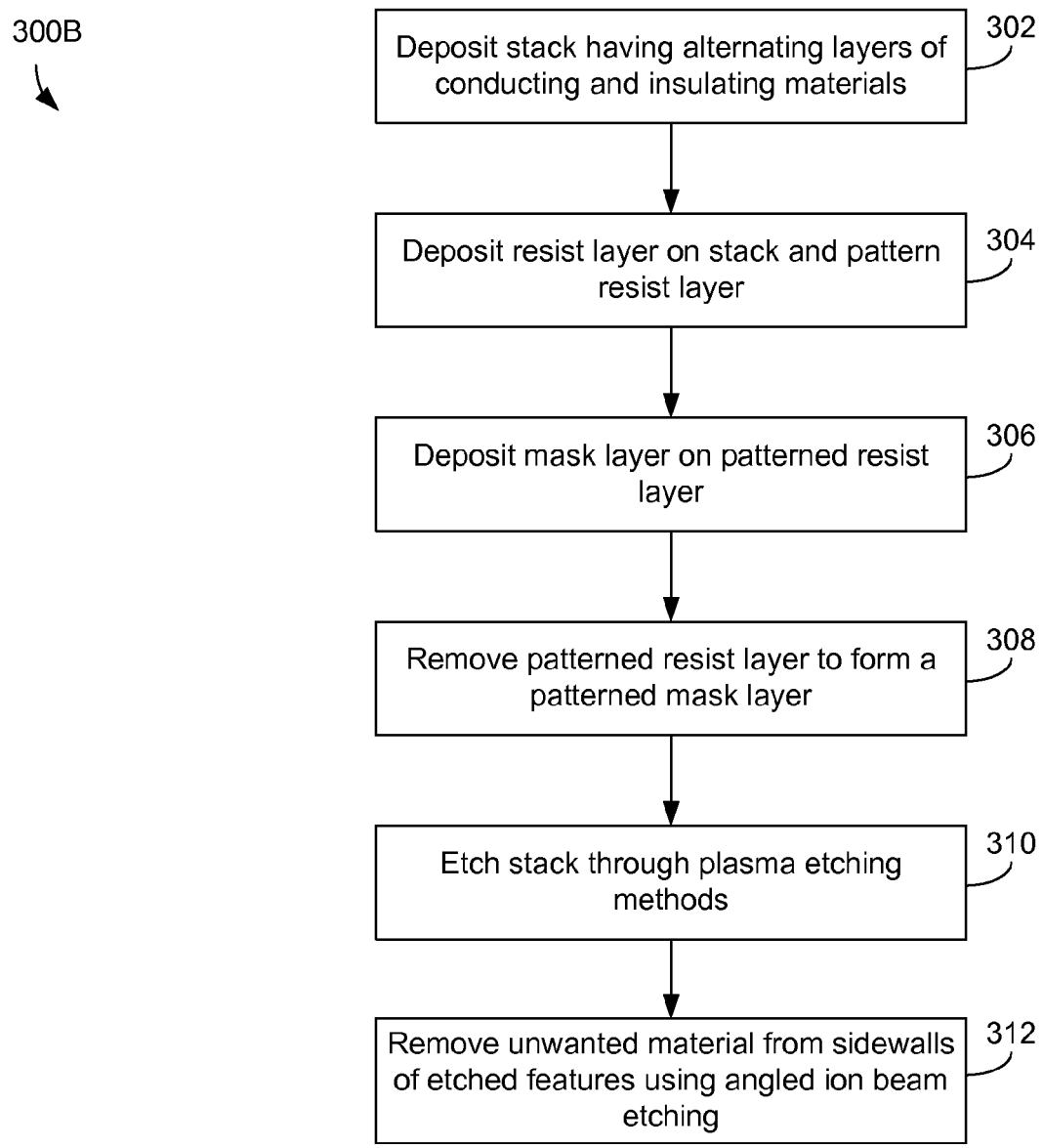
FIG. 3B is a flowchart illustrating a broader semiconductor fabrication method in which the disclosed techniques may be used.

FIG. 3B illustrates an exemplary semiconductor fabrication process that may benefit from the disclosed techniques. In particular, FIG. 3B relates to a broader fabrication context in which the angled etching process described in FIG. 3A may take place. An example of this broader semiconductor fabrication method is further discussed and described in U.S. Pat. No. 6,689,283, titled DRY ETCHING METHOD, MICROFABRICATION PROCESS AND DRY ETCHING MASK, which is incorporated herein by reference in its entirety.

The process 300B begins at block 302, where a stack having alternating layers of conducting and insulating materials is deposited on a substrate. In one embodiment, the stack is made of alternating layers of conductive and insulating materials. In various cases, the substrate on which the stack is deposited is a semiconductor wafer. Next, at block 304, a resist layer is deposited on the stack of alternating layers. The resist layer may be micro-patterned using a lithography technique. In a particular case, the patterned resist layer is e.g., a positive-type resist deposited using a spin-coating method and patterned using UV or electron-beam exposure equipment. At block 306, a mask layer is deposited on the patterned resist layer. In some cases, the mask layer is made of titanium nitride (TiN), which may be deposited through a reactive sputtering method.

Figure 3C:
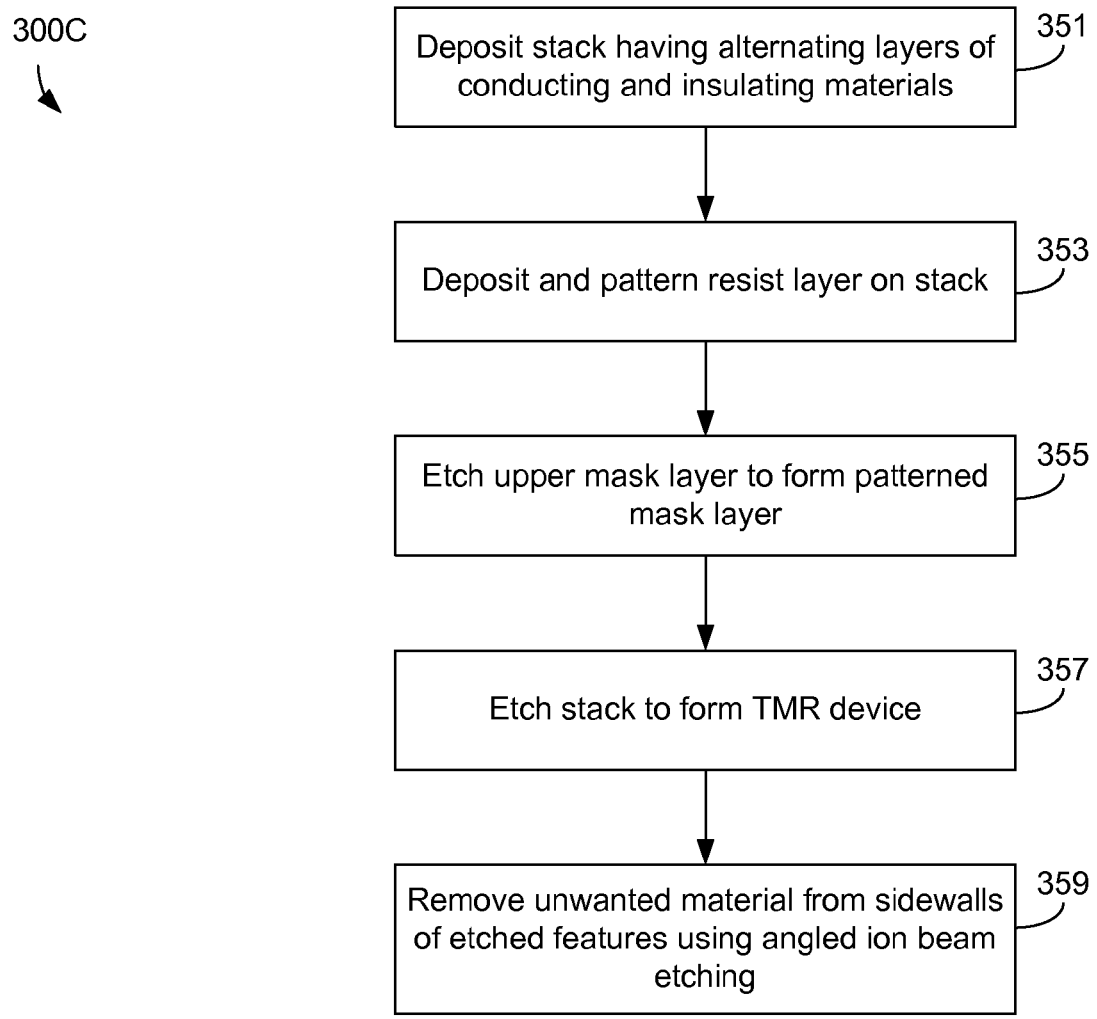
FIG. 3C is a flowchart illustrating an alternative broad semiconductor fabrication method in which the disclosed techniques may be used.
Figure 3D:
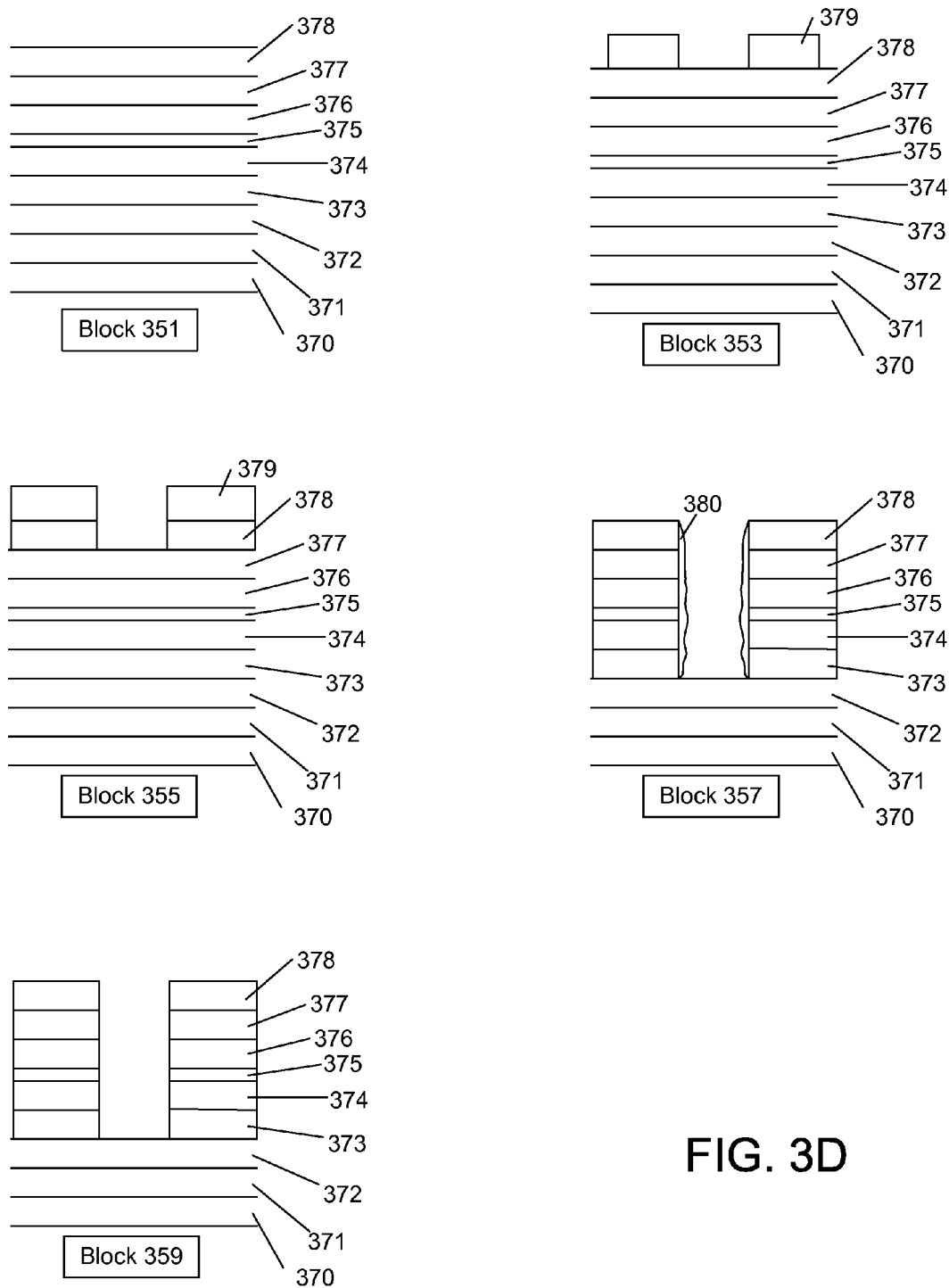
FIG. 3D shows a partially fabricated semiconductor device at the various stages of production disclosed in FIG. 3C.

Next, at block 308, the patterned resist layer is removed to form a patterned mask layer. In some embodiments, the removal may be accomplished through a lift-off method by dipping the substrate in a solvent bath and applying ultrasonic energy to remove the patterned resist. Next, the stack on the substrate may be etched at block 310 to form an etched stack. The etching may occur through plasma etching techniques, for example, which often leave some amount of unwanted material on the sidewalls of the etched features. Then at block 312, the angled ion beam etching techniques disclosed herein may be used to remove the unwanted material from the sidewalls of the etched features. For example, the process 300A represented shown in FIG. 3A may be implemented in operation 312. FIGS. 3C-3D illustrate an additional exemplary semiconductor fabrication process that may utilize the disclosed techniques. FIG. 3C is a flowchart explaining the main processing operations, while FIG. 3D shows a partially fabricated semiconductor device after each stage of FIG. 3C. An example of this semiconductor fabrication method is described in U.S. Pat. No. RE40,951, titled "DRY ETCHING METHOD FOR MAGNETIC MATERIAL," which is incorporated by reference herein in its entirety.

The process 300C begins at block 351, where a stack having alternating layers of conducting and insulating materials is deposited. In one example, the layers include Ta 370, Al 371, Ta 372, PtMn 373, CoFe 374, $Al_2O_3$ 375, CoFe 376, NiFe 377, and Ta 378 (from closest to the wafer to farthest from the wafer). Layers 374-376 (the CoFe/$Al_2O_3$/CoFe set) constitute the alternating layers of conducting and insulating materials. The upper CoFe layer 376 may be referred to as a free layer, and the lower CoFe layer 374 may be referred to as a pinned layer. The PtMn layer 373 is an antiferromagnetic layer. Next, at block 353, a resist layer 379 is deposited and patterned according to known techniques. Then, at block 355, the uppermost layer of Ta 378 is etched to form a patterned mask layer 378. In this way, the pattern on the resist layer may be transferred to the mask layer. Ta is suitable for use as a mask layer when etching magnetic layers, including the CoFe layers 374 and 376, the $Al_2O_3$ layer 375, and the PtMn layer 373. After the mask layer is etched/patterned in this first etch procedure, layers 370-377 are unetched/continuous, while layers 378-379 are etched/patterned. In one embodiment, this first etching procedure is conducted with $CF_4$ gas. The photoresist layer 379 may be removed after the first etching procedure at block 355.

Next, at block 357 a second etching procedure is performed in which layers 373-377 are etched. In some cases, the second etching procedure utilizes methanol as an etchant. After this second etching procedure, layers 372 and lower layers are unetched/continuous, while layers 373 and higher layers are etched/patterned. The Ta layer 372 acts as a mask to protect the underlying layers, much as the patterned Ta layer 378 acts as a mask for the underlying layers in the regions where layer 378 is present. By using this process, a tunneling magnetoresistance structure (TMR) can be formed. A layer of deposited material 380 may form on the sidewalls of the etched stack during this second etching procedure. Further, although the stack in FIG. 3D, Block 357 is shown with a perfectly vertical etch profile, this is may not be the case, and the sidewalls may be more slanted, as shown in FIGS. 2C-2D. The layer of deposited material 380 may form a short between the CoFe layers 374 and 376. To address this problem, the techniques described herein may be utilized at block 359 to perform angled ion etching, thereby removing the material deposited on the sidewalls and improving the device.

Etching Mechanism

In some cases, the removal of unwanted material from the sidewall of an etched feature may be accomplished through the use of ion sputtering alone. In other embodiments, reactive chemistry is used along with the ion exposure to facilitate material removal. Where reactive chemistry is used, one purpose of the ions may be to activate the surface for reaction.

The embodiments herein may be used to etch various materials. For example, in some implementations, the material to be etched can contain a film or a stack containing multiple films with the following elements or their compounds and alloys: Ta, Ni, Fe, Co, Ru, Pt, Mn, Ir, Si, Cu, Mg, Zr, Pb, O, N, etc. This list is not exhaustive and is not intended to be limiting. In some embodiments, the substrate to be etched is a partially fabricated MRAM or ReRAM device. Further, the material to be etched may be a stack of materials deposited on a substrate. The stack may have alternating/interleaving layers of dielectric and conductive materials. In a particular embodiment, the stack has at least one conductive-dielectric-conductive layer sandwich (i.e., a layer of dielectric material positioned between two layers of conductive material).

The plasma generating gas is the gas delivered to the upper plasma generation chamber. This gas is used to produce and/or maintain a plasma in this space. Typically, the role of the plasma is to be a source of ions for injection into the lower processing chamber. These ions may be inert or reactive.

Examples of inert gas that may be used include helium, neon, argon, krypton and zenon. Examples of reactive gas that may be used include, but are not limited to, hydrogen ($H_2$), oxygen ($O_2$), nitrogen ($N_2$), methane ($CH_4$), carbon tetrafluoride ($CF_4$), chlorine ($Cl_2$), hydrogen bromide (HBr), ammonia ($NH_3$), phosphorus trifluoride ($PF_3$), carbonyl fluoride ($COF_2$), carbon monoxide (CO), nitric oxide (NO), methanol ($CH_3OH$), ethanol ($C_2H_5OH$), acetylacetone ($C_5H_8O_2$), hexafluoroacetylacetone ($C_5H_2F_6O_2$), thionyl chloride ($SOCl_2$), thionyl fluoride ($SOF_2$), acetic acid ($CH_3COOH$), pyridine ($C_5H_5N$), and/or formic acid (HCOOH). In various embodiments, a combination of these etching reactants is used. For example, in some cases a combination of CO+NO is used. In another case, a combination of $CO_2$+$NO_2$ is used. In a further case, pyridine is combined with thionyl chloride and/or thionyl fluoride. Other combinations are possible, as well. The gas used to create the plasma may be chosen to reduce or eliminate unwanted reactions in the reaction chamber, based in part on the etching chemistry used and the material to be etched. These materials and reactions are merely exemplary and are not meant to limit the embodiments in any way. One of ordinary skill in the art would understand that the techniques herein may be used with a variety of materials and reactions.

Where a reactive gas is used, it may be delivered as part of the plasma generating gas, or it may be delivered separately. For example, in one embodiment the reactive gas is delivered to the plasma generating chamber (with or without an inert plasma generating gas). In another embodiment, the reactive gas is delivered directly to the lower processing chamber while another gas stream delivers plasma generating gas to the upper plasma generation chamber.

The mechanism for removal of the unwanted material from the sidewall of a feature will depend on the choice of gas delivered to the plasma generation chamber and the processing chamber. In the case where inert gas is delivered to the plasma generation chamber and no reactive gases are used, removal may be dominated by ion etching. In contrast, where the plasma generation gas includes reactive species, the removal may be influenced or dominated by reactive ion etching. Further, in cases where the plasma generation gas includes inert ions and a separate etchant source is delivered directly to the lower processing chamber, a different removal mechanism may dominate.

Ion etching may be used in various implementations. Ion etching generally refers to the removal of atoms by physical sputtering with an inert gas. Physical sputtering is driven by momentum exchange between the ions and the materials with which they collide. Upon impact, the incident ions set off collision cascades in the target. When such cascades recoil and reach the target surface with an energy greater than the surface binding energy, an atom may be ejected, known as sputtering.

In other embodiments, reactive ion etching is used to remove the unwanted material. In this case, chemically active ions and/or radicals may react with the unwanted material to aid in its removal. In some cases, a combination of ion sputtering and radical induced reactions are used.

In the case where an etchant gas is delivered directly to the lower processing chamber and a plasma generating gas is delivered to the plasma generation chamber, the removal mechanism may be somewhat different. Without wishing to be bound by any theory or mechanism of action, it is believed that ion bombardment may generate active sites on the substrate by creating dangling bonds and/or other physicochemically receptive features on the metal or other material to be etched. Activation by ion bombardment is conventionally achieved through exposure to plasma. In these conventional applications, the plasma is typically generated in a region immediately above the substrate, and an electrostatic chuck used to support the substrate may be biased to attract ions onto the substrate's surface.

In the present embodiments, ion bombardment occurs in a different way. For instance, the plasma may be generated primarily or exclusively in the upper plasma generation chamber, which is separated from the processing chamber (where the substrate is situated) by the ion extractor plate. Thus, in various implementations, the substrate may not be directly exposed to a plasma environment. The ion extractor plate and electrostatic chuck may be biased in order to accelerate ions from the upper plasma generation chamber, through the ion extractor grid, and into the lower processing chamber where they may strike the substrate to activate and/or sputter the surface as described.

In some cases, gas supplied to the lower sub-chamber during the etching process includes not only the etchant gas but one or more other gases. The additional gas may be, for example, oxygen, hydrogen or nitrogen. This gas may react with the surface of the substrate to form a metal oxide, metal hydride or metal nitride, for example. This oxide/hydride/nitride material may be easier to etch than the bare metal, in some cases. The additional gas may be supplied continuously or in pulses. When pulsed, the second process gas may be supplied in an alternate repeating cycle of pulsed etching gas and pulsed second process gas.

In another embodiment, the material which drives formation of the oxide/hydride/nitride is delivered in ionized form from the upper sub-chamber to the lower sub-chamber. In some implementations, the surface of the substrate is exposed to an alternating stream of chemically inert ions and chemically reactive ions.

Delivery of the gases to the upper plasma generation chamber and lower processing chamber may be accomplished by any of various mechanisms. In one embodiment, inlet nozzles are positioned in the upper and lower chambers. There may be a plurality of inlets for each chamber. In one implementation, many inlets are placed around the perimeter of the sub-chambers to provide a uniform flow of process gases. In another embodiment, the ion extractor plate acts as a showerhead to provide gases to either or both of the upper and lower sub-chambers. In another case, gases may be supplied through a central nozzle extending into each sub-chamber. The plasma generation gas is delivered to the plasma generation chamber, while an additional gas (e.g., an etchant gas) may be delivered to either the plasma generation chamber or to the processing chamber. One of ordinary skill in the art would understand that different forms of gas delivery may be used within the scope of the disclosed embodiments.

Plasma Generation

Plasma is generated in the upper plasma generation chamber. Gases suitable for forming the plasma are described above in the Etching Mechanism section. Various types of plasma generation techniques may be used to generate the plasma in the plasma generation chamber. In one embodiment, the plasma is an inductively coupled plasma that is generated, for example, through the use of coils positioned above the plasma generation chamber. In another embodiment, the plasma is a capacitively coupled plasma, microwave plasma or an electron cyclotron resonance (ECR) plasma. In the case of an inductively coupled plasma, a wide range of excitation frequencies may be used. In certain cases, the excitation frequencies are radio frequencies or microwave frequencies. An example of a plasma generation reactor that may be modified according to the teachings herein is the Kiyo reactor, available from Lam Research Corporation of Fremont, Calif.

In some implementations, the pressure in the plasma generation chamber is fairly low (e.g., about 20 mTorr or less, or about 5 mTorr or less, or between about 1-2 mTorr). One reason for using a low pressure plasma is to reduce the likelihood that ions collide with gas in the plasma. When ions collide with gas atoms/molecules, they lose directionality and momentum and thus become less useful in removing unwanted deposits from the substrate. Another reason to use a low pressure plasma is to reduce the likelihood of forming a plasma in the lower processing chamber. Although in some cases it is preferable to use a high density plasma (such plasmas having a higher number of ions that may be used for processing), the plasma density should not be so great that the plasma leaks through the grid and into the lower processing chamber. In some embodiments, the density of the plasma in the plasma generation chamber is between about $5e9$ cm$^{-3}$-$1e12$ cm$^{-3}$, or between about $1e10$ cm$^{-3}$-$5e11$ cm$^3$.

In certain embodiments, the ion extractor plate does not play a significant role in plasma generation. However, the extractor plate may play a role in confining the plasma to the upper plasma generation chamber and filtering out species for delivery to the lower processing chamber.

Position of the Ion Extractor Plate in the Reactor

The ion extractor plate is positioned in the reaction chamber, thereby dividing the reaction chamber into an upper plasma generation chamber and a lower processing chamber. These chambers are also sometimes referred to as the upper and lower chambers or sub-chambers. An example of a reaction chamber suitable for modification to include the ion extractor plate as described herein is a Kiyo reactor from Lam Research Corporation of Fremont, Calif. For context, the following description may be considered with reference to FIG. 1, which is further described above.

In some embodiments, the periphery of the extractor plate is coextensive with (or nearly coextensive with) the periphery of the reaction chamber, which is roughly coextensive (e.g., within about 5% or within about 10%) with the periphery of the substrate being processed. In some cases, however, the periphery of extractor plate and reaction chamber extend beyond the periphery of the substrate. While it may be desirable to design the reaction chamber/extractor plate to be larger than the substrate (such that the radially inward sidewalls of etched features may be more thoroughly bombarded by ions), the benefits of such a large apparatus must be weighed against the substantially increased space the apparatus would occupy, as well as the significantly increased amount of power that would be required to sustain a greater amount of plasma in the increased volume of the plasma generation chamber. As such, in some embodiments, the diameter of the substrate being processed is between about 50-90%, or between about 60-90% the diameter of the ion extractor plate. In some implementations, the outer edge of the extractor plate is separated from the inner surface of the reaction chamber wall in order to minimize the risk of arcing, which can occur when chamber wall is held at ground and the extractor plate is biased. In one example, the outer edge of the extractor is separated from the chamber wall by a gap of at least about 3 cm.

The distance between the plating face of the substrate and the lowest surface of the corrugated portion of the ion extractor plate (or in some cases the average position of the corrugated portion of the extractor plate) should be relatively small (e.g., less than about 10 cm, or less than about 8 cm, or less than about 5 cm). This relatively small separation distance helps ensure that the electric field between the plate and chuck is weak, such that a plasma is not sustained in the lower processing chamber. In these or other implementations, the ion extractor grid may be positioned between about 10-25 cm from a ceiling of the upper plasma generation chamber.

The extractor plate should not be positioned too close to the substrate, however, as this may cause printing of the plate's surface pattern to occur on the wafer's face. In other words, the pattern of apertures in the extractor plate may undesirably appear on the face of the substrate after processing, causing significant etch non-uniformities. For many applications, a separation distance of at least about 1 inch from the top of the substrate to the bottom of the extractor plate is sufficient to avoid such printing.

Ion Extractor Plate Design

A variety of designs may be used to implement the ion extractor plate. Exemplary extractor plates are shown in FIGS. 4A-4D, and are further described below. Generally, the plate will include a corrugated surface with apertures extending through the thickness of the plate. In various embodiments, a single extractor plate is used. Many or all of the apertures may be oriented such that they are both normal to the local surface of the extractor plate, as well as angled with respect to the face of the substrate.

The diameter or other principal dimension of the apertures should be large enough to permit the transfer of a sufficient amount of ions from the upper to lower chambers. The principal dimension of an aperture is in a direction parallel to the local surface of the extractor plate and spans the longest linear path in this direction in an aperture. The principal dimension is measured on the side of the extractor plate that faces the upper plasma generation chamber. Where the principal dimension of an aperture is too small and/or there is an insufficient number of apertures on a plate, relatively few ions will enter the lower processing chamber to interact with the substrate. A high fraction of the ions generated in the plasma generation sub-chamber will collide with a sidewall of the aperture or with the top of the plate, where they are not useful. In some cases, the diameter or other principal dimension of the apertures is at least about 0.5 mm, or at least about 1 mm. Where the extractor plate is made from a fine mesh (instead of a plate with holes), the apertures may be smaller. As explained below, there is an upper bound on acceptable aperture dimensions. A suitable range of aperture principal dimensions may be about 0.5 to 5 mm.

The diameter or other principal dimension of the apertures should be small enough to maintain a continuous plasma sheath over the aperture/plate. Where the apertures are too large, the plasma sheath may wrap around, significantly dip near, or otherwise become too non-uniform in the proximity of the aperture. If the plasma sheath is allowed to become discontinuous (e.g., where an aperture is too large, such that the sheath wraps around the edges of the aperture), there is a possibility that plasma in the plasma generation chamber will leak through the opening in the plasma sheath, through the aperture, and into the lower processing chamber. This may be problematic because in many embodiments, the lower processing chamber should be substantially free of plasma.

The shape of a plasma sheath proximate an aperture is important because the shape/orientation of the sheath help determine the trajectory at which ions are directed through the ion extractor plate and into the lower processing chamber. In particular, ions tend to be directed at an angle perpendicular to the direction of the local edge/boundary of the plasma sheath. While some degree of dip in the plasma sheath near an aperture may be acceptable in certain embodiments, the dip/dimple should not be so large that an unacceptable amount of ions are caused to hit the plate/sidewalls as they travel through the apertures. In implementations where the aperture size is designed to allow some relatively small degree of dip in the plasma sheath, the trajectory of the ions may be somewhat less collimated and more spray-like. Thus, a small degree of dip in the plasma sheath may be beneficial in achieving a wider range of incident ion angles over the substrate. In some embodiments, the diameter or other principal dimension of the apertures is about 5 mm or less, or about 3 mm or less. In certain cases, the thickness of the plasma sheath is between about 200 µm-1 mm.

Another way to characterize the apertures is the ratio between the principal dimension of the aperture to the thickness of the plasma sheath (e.g., $D_{ap}/T_s$, where $D_{ap}$ is the diameter or other principal dimension of an aperture and $T_s$ is the thickness of the sheath). This ratio is referred to as the aperture to sheath ratio, and in some embodiments it is between about 0.5-15, or between about 0.5-4.

Figure 5A:
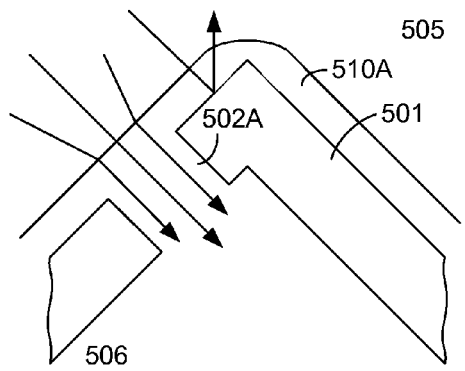
FIGS. 5A-5D show corrugation features of an ion extractor grid, specifically highlighting the effect of the size/shape of the apertures on the trajectory of ions.
Figure 5B:
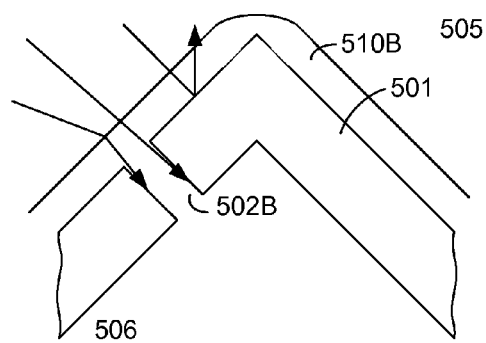
Figure 5C:
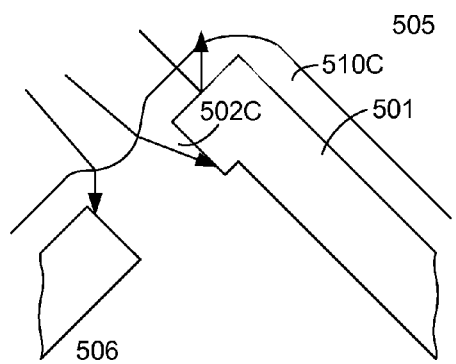

FIGS. 5A-5C illustrate the aperture size concepts described above. These figures are not necessarily drawn to scale, and are merely provided for the sake of clarity. In each of these figures, the arrows represent the trajectory of ions. Only a single corrugation peak of the ion extractor plate 501 is shown. FIG. 5A shows an angled aperture 502A in ion extractor plate 501. In FIG. 5A, the diameter of the aperture 502A is appropriate, such that an acceptable number of ions may pass through from the upper processing chamber 505 to contact the substrate (not shown) in the lower processing chamber 506. Further, the plasma sheath 510A is continuous and fairly uniform over the aperture. FIG. 5B shows an aperture 502B having a diameter that is too small. Though the shape of the plasma sheath 510B is acceptable, too many ions will collide with the sidewalls of the aperture 502B, and an insufficient number of ions will be able to pass through into the lower processing chamber 506. Apertures which are too small, such as the one shown in FIG. 5B, result in insufficient removal of unwanted material from the substrate. Next, FIG. 5C shows an aperture 502C that is too large. Here, the shape of the plasma sheath 510C is non-uniform proximate the aperture, and therefore, a significant fraction of the ions will not be properly directionally directed. In particular, ions will be directed in a direction normal to the local surface/boundary of the plasma sheath 510C. Because this local surface/boundary is not perpendicular to the direction of the aperture through the extractor plate, the ions will likely collide with a sidewall of the aperture. In some embodiments, it is desirable to have a limited slightly dimpled sheath boundary above the aperture. This produces a conical or spray distribution of ion directions through the aperture, which increases the range of angles impacting trench sidewalls a in local region of the substrate.

Figure 5D:
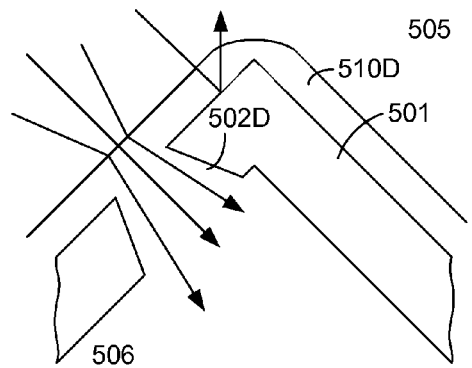

FIG. 5D illustrates an embodiment where the aperture 502D is shaped like a truncated cone. In other words, the area of the aperture is lower on the upper surface of the extractor plate 501 (facing the plasma generation chamber 505) as compared to area of the aperture on the lower surface of the extractor plate 501 (facing the processing chamber 506). With this configuration, ions are less likely to collide with a sidewall of the aperture 502D because as the ions travel through the plate 501, they have an increasing amount of area/volume through which to travel. As such, some ions which would otherwise collide with a sidewall are able to pass through into the lower processing chamber 506. Further, because the area of the aperture on the upper surface of the extractor plate is relatively small, the shape of the plasma sheath will be fairly uniform. This type of coned aperture design may result in a less collimated, more "spray-like" delivery of ions into the lower processing chamber 506. As mentioned, this may be beneficial in achieving a range of incident ion angles over the substrate.

The size and shape of the aperture may be tailored to provide a desired set of ion trajectories. In some cases, the apertures are designed to provide tight collimated supplies of ions from some or all of the individual apertures. In these or other cases, some or all of the apertures are designed to provide a spray of ions over a range of directions. In some embodiments, a plate is designed to have apertures with conical cross sections and sufficiently large principal dimensions to create minor dimpling in the local sheath boundary.

In various embodiments, some or all of the apertures are circularly shaped. In certain embodiments, however, some or all of the apertures have a non-circular shape. Example aperture shapes (as viewed from a plane parallel to the local surface where the aperture is located) may include ovals, slots, polygons C-shapes, T-shapes, etc.

A related factor which may affect the degree of ion collimation is the thickness of the extractor plate. Generally, a thicker plate will lead to more collimated ion trajectories, while a thinner plate will lead to a wider range of trajectories. The extractor plate should be thick enough such that it has structural integrity and does not substantially bow downwards near the middle. In some embodiments, the extractor plate is at least about 1 mm thick, or at least about 3 mm thick. Further, the extractor plate should be thin enough such that an acceptable flux of ions is achieved. In some embodiments, the extractor plate is less than about 25 mm thick, or less than about 10 mm thick.

The ion extractor plate will have a certain amount of open area. The open area is defined as the total amount of area through which there is a clear line-of-sight from the upper plasma generation chamber to the lower processing chamber. Due to the corrugation of the extractor plate and the corresponding angled nature of the apertures, not all of the clear lines-of-sight will be simultaneously visible from a single vantage point. The open area is calculated based on the surface area and aperture area on the upper side of the ion extractor plate (i.e., the side facing the plasma generation chamber). In some embodiments, the total open area of the ion extractor plate is between about 1%-50%, or between about 10%-40%. In one embodiment, the open area is about 30%.

Returning to FIGS. 4A-4D, the ion extractor plate may be designed in numerous ways. In general, it is preferable to have the ions directed at a range of angles such that the ions are best able to penetrate into the etched features and remove material deposited on the sidewalls of such features. Because a sidewall on a given substrate may be oriented in many different directions at any particular location on the substrate, it is beneficial to use a large variety of ion trajectories to achieve a wide range of incident ion angles. In this way, it is more likely that each and every sidewall of an etched feature will be exposed to ions capable of cleaning off the unwanted material deposited thereon, thereby achieving superior removal results.

In some embodiments, the plate includes a plurality of cones. Each cone may contain one or more apertures (e.g., at least about 2 apertures, at least about 3 apertures, or at least about 4 apertures) which are oriented normal to the local surface of the cone on the extractor plate. In some embodiments, the cones vary in height and/or diameter. These geometric variations allow the ions to be directed at varying angles toward the substrate. Other factors which may vary between the cones are the placement/orientation of the apertures, as well as the number of apertures per cone.

FIG. 4A illustrates an ion extractor plate 400A having this type of apertured-cone structure, as viewed from above. Each of the small circles 403 represents a cone. The black dots 405 in the center of each cone represent the peak of the cone. The ovals (shown here in pairs of 4) represent the apertures 407. The apertures 407 have an ovular cross section from this perspective due to the angled surface of the cones. Though the cones 403 are only illustrated on a portion of the extractor plate, it is understood that such cones may extend across the entire surface of the plate. In another embodiment, the cones are truncated such that the apex of the cone is a small, flat surface, rather than a point. For the purposes of this application, the truncated cone structure is considered a cone structure, unless otherwise indicated. A plate with a single truncated cone would not be considered corrugated; however, a plate having a plurality of truncated cones over the surface of the plate would be considered corrugated, as it will have some alternating downward and upward slanting surfaces (e.g., between adjacent cones). Similarly, hemispherical, oval, and egg-shaped indentations may also be considered cone structures, unless otherwise indicated. In a related embodiment, the extractor plate may have pyramid structures, rather than cone structures. Each face of a pyramid structure may have one or more apertures.

In another embodiment, the extractor plate has a plurality of corrugated sections which are offset from one another. In one example, the sections are pie-shaped. In another example, the sections are rectangular. FIG. 4B shows an ion extractor plate 400B having a plurality of pie-shaped corrugated sections which are offset from one another. In this embodiment, there are two alternating types of pie-shaped segments 404 and 406. The apertures 407 are again shown by ovals. For the sake of clarity, the apertures 407 are only shown on two of the eight segments, but it is understood that the apertures 407 are present on each of the segments 404 and 406 on the plate 400B. The heavy solid lines 409 show the divisions between the pie-shaped segments 404 and 406. The thin solid lines 411 represent peaks/crests that are present in a corrugated segment. The dotted lines 413 represent the valleys between the peaks. In other words, the thin solid lines 411 show features "coming out of the page" while the dotted lines 413 show features "going into the page."

By using a number of segments with different aperture patterns/angles, a range of incident ion angles may be achieved to maximize removal results. In the embodiment of FIG. 4B, two distinct segment patterns are used. One segment pattern 406 is accordion-like, having a series of alternating peaks and valleys. Because the apertures 407 are oriented normal to the local surface of the extractor plate, ions traveling through apertures in this type of segment 406 will be directed in a direction radially offset from the aperture positions (i.e., either towards or away from the center of the plate). The other segment pattern 404 shown in FIG. 4B has a top surface shape that is roughly trigonal pyramidal. As shown in FIG. 4B, the peak of the pyramid may be offset toward the outside of the plate, rather than at the center point of the radius. Further, the outer edge may be somewhat curved due to the curvature of the circular plate 400B. The apertures 407 in this segment 404 direct ions in a non-radial direction (neither directly towards, nor directly away from the center of the plate). In some cases, the apertures 407 in this segment 404 direct ions in a direction perpendicular to a radial direction.

That is, these apertures 407 may direct ions in a direction that is generally azimuthally offset from the position of the apertures.

Figure 4C:
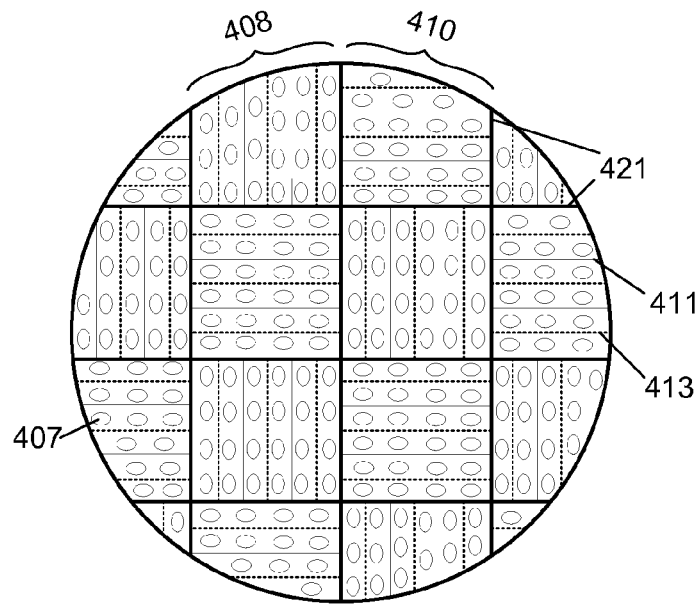

FIG. 4C shows an additional embodiment having varying corrugated segments. In this embodiment, the segments 408 and 410 are roughly square shaped, and are separated in the figure by thick solid lines 421. Here, the segments 408 and 410 alternate between two corrugation patterns which are perpendicular to one another. The peaks of the corrugation are shown in thin solid lines 411 while the valleys of the corrugation are shown in dashed lines 413. The apertures 407 are shown as ovals.

Figure 4D:
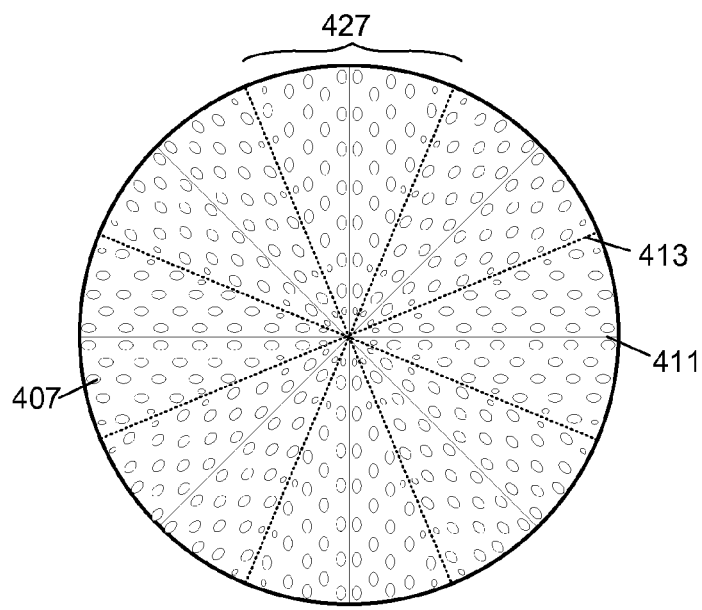

FIG. 4D shows an alternative embodiment having corrugated pie-shaped segments 427. Again, the peaks of the corrugation are shown in thin solid lines 411 while the valleys of the corrugation are shown in dashed lines 413 and the apertures 407 are shown as ovals.

In each of the embodiments shown in FIGS. 4A-4D, the height of the peaks, the depth of the valleys, and the distance between such peaks and valleys may vary to provide a range of angles over which the ions are directed into the lower processing volume. Alternatively, the peak-valley height and/or the horizontal distance between peaks and valleys may be constant over the face of the plate. FIGS. 4A-4D provide non-limiting examples of corrugation features which may be used in implementing the disclosed embodiments. For the purpose of this application, a corrugation feature is considered to be the smallest set/pair of upwards and downwards slanting surfaces. For example, a single cone contains both upwards and downwards slanting surfaces (when viewed from the side), and is therefore considered to be a corrugation feature. Similarly, one "peak to peak" or "valley to valley" of an accordion-shaped corrugation structure is considered to be a corrugation feature. Where larger pyramidal structures are used, such as segment 404 in FIG. 4B, the entire pyramidal segment is considered to be a single corrugation feature.

In certain implementations, the ion extractor plate is movable relative to the substrate. This movement may occur through rotation or translation. The translation-type movement may occur by, for example, moving the extractor plate in the z-direction, i.e., towards and/or away from the substrate, and/or moving the extractor plate in the x- and/or y-direction, i.e., in a direction parallel to the face of the substrate, or some combination of these movements. While in some embodiments the substrate support itself may be movable, in various cases the ion extractor plate is movable while the substrate support and substrate remain stationary. When compared to certain conventional designs where the substrate support moves, this movable extractor plate design has relatively few design elements/constraints which must be taken into account. For example, where the substrate support is movable, any electrical, fluidic or other connections to the electrostatic chuck must be designed to accommodate such movement. These accommodations may be fairly extensive in terms of space and cost.

Movement of the ion extractor plate is beneficial because the movement results in more uniform delivery of ions over the surface of the substrate. Without such movement, ions may follow specific collimated trajectories after leaving the apertures in the extractor plate, such that only certain portions of the substrate surface are actually bombarded by ions. By rotating and/or translating the extractor plate, the area over which the ions impact the substrate may be spatially averaged or otherwise spread out. Furthermore, the apertures in adjacent peaks/valleys and/or the apertures in adjacent extractor plate segments may be slightly or significantly offset from one another to help achieve such spatial averaging of the ion bombardment. In this way, more uniform bombardment is achieved. In some cases, a small degree of rotation may be used (e.g., between about 5-20°) to help even out the ion delivery. This small rotation may be useful where distinct angularly repeating extractor plate segments are not used. On the other hand, where angularly repeating segments are used, the degree of rotation may need to be larger. In certain embodiments, the rotation covers an angular path that projects the full range of corrugation features to any position on the substrate. In some embodiments, a translational actuator is included to move the ion extractor plate closer to/farther from the substrate to similarly even out the ion delivery.

Rotation of the ion extractor plate may be accomplished by various means. In the embodiment of FIG. 1, for example, a rotational actuator is connected to supports which are connected to the ion extractor plate. The rotational actuator is able to move the extractor plate through movement of the supports. In another embodiment, a translational actuator may be used to move the ion extractor plate towards and away from the substrate. In some embodiments, the extractor plate is held in place and/or moved by another type of movement causing element such as a belt, gears, etc.

Rotation of the ion extractor plate is especially beneficial where the plate includes repeating segments of corrugation/apertures, such as the embodiment shown in FIG. 4B. Where repeating segments are used, the degree of rotation should, as indicated, be sufficient to expose each part of the substrate to each full segment type. This degree of rotation is marked by the curved double arrow in FIG. 4B. In another example where only two distinct segments are used and each segment occupies a 180° span of the extractor plate, the plate should rotate 360°. Similarly, where the plate includes 16 individual segments (8 of a first type alternating with 8 of a second type), and each segment occupies a 22.5° span of the extractor plate, the plate should rotate at least about 45°.

In some implementations, the degree of rotation is at least about double the angular extent of the widest segment. Where more than two types of segments are used, however, the degree of rotation should be greater. For example, where three sets of four repeating angularly equal segment types are used for a total of 12 segments (e.g., a clockwise segment order of A-B-C-D/A-B-C-D/A-B-C-D, where A, B, C and D represent different types of segments), the degree of rotation should be at least about 120°. This angle of rotation ensures that each part of the processing face of the substrate is exposed to ions from a full A segment, a full B segment, a full C segment and a full D segment. It may be beneficial to use a larger number of smaller segments, as opposed to a smaller number of larger segments. This arrangement allows the degree of rotation to be smaller, thereby simplifying the reactor design. In some embodiments, the degree of rotation during processing is between about 15-180°, or between about 20-120°, or between about 30-90°.

In some cases, the number of distinct segment types is between about 1-36 (e.g., between about 2-10, or between about 2-5). A segment type is distinct from another segment type if the design/geometry/position of the corrugation peaks and valleys is different between the segments, or if the placement of apertures is different between the segments. For example, a pie-shaped accordion-like segment is distinct from another pie-shaped accordion-like segment if the peaks and valleys between the two segments are inverted/switched, even if the segments are otherwise identical.

In one particular embodiment, the extractor plate includes four distinct segment types A, B, C and D. Segment type A resembles the roughly trigonal pyramidal segment shown as the upper segment in FIG. 4B. Segment type B resembles the accordion-like segment shown as the upper right segment in FIG. 4B. Segment types C and D are similar to types A and B, respectively, but use peaks in place of valleys and valleys in place of peaks. The series of distinct segment types repeats 4 times (A-B-C-D/A-B-C-D/A-B-C-D/A-B-C-D) (with 16 total segments, each segment is half as wide as the segments shown in FIG. 4B). With this design, the degree of rotation may be about 90°, sufficient to expose the substrate to a single full range of segment types A-D. By inverting the peaks and valleys in the ion extractor plate corrugation between segments and rotating the extractor plate during etching, a wider range of incident ion angles may be achieved over local parts of the substrate.

Figure 6A:
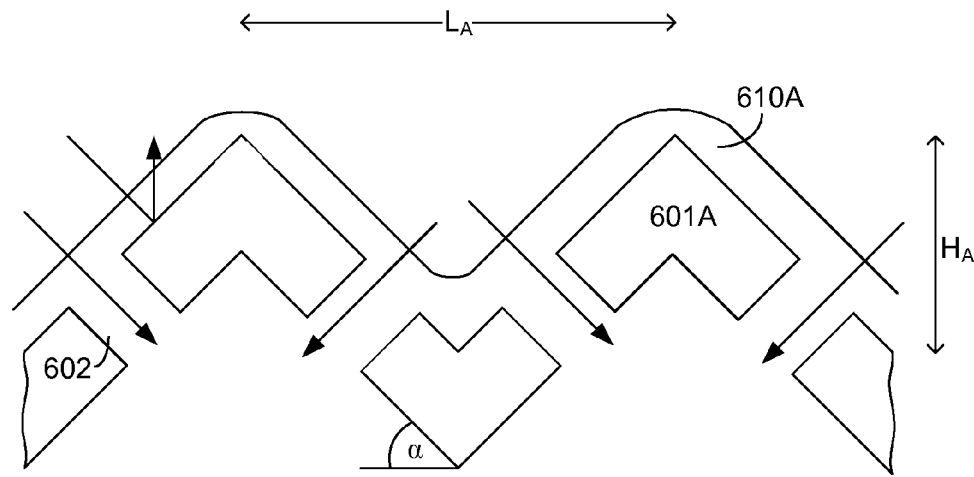
FIGS. 6A-6B show corrugation features of an ion extractor grid, specifically highlighting the effect of the length of the corrugation scale on the trajectory of ions.
Figure 6B:
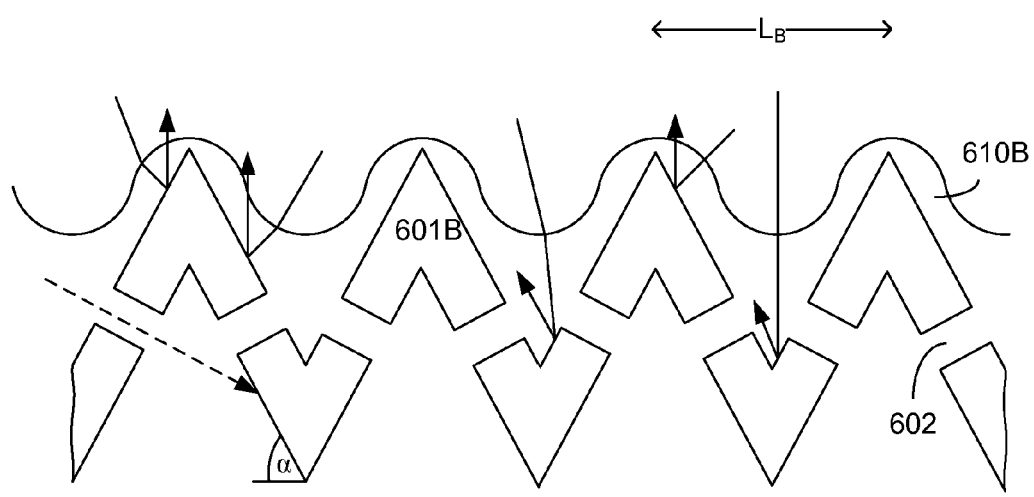

Another important factor in ensuring that ions are properly directed toward the substrate is the scale of corrugation used on the ion extractor plate. FIG. 6A illustrates a cross-sectional view of part of an ion extractor plate 601A having apertures 602, as viewed from the side. The solid arrows in FIGS. 6A-6B represent the trajectory of ions (the dotted arrow in FIG. 6B is discussed below). The length of the corrugation scale is defined as the distance between adjacent peaks in the corrugation, and is labeled in FIG. 6A as dimension $L_A$. As is shown in FIG. 6A, this dimension should be sufficiently large such that the plasma sheath 610A is able to follow the surface shape of the extractor plate 601A.

In contrast, FIG. 6B shows a cross-sectional view of part of an ion extractor plate 601B, which has a corrugation length dimension $L_B$, which is too small. In other words, the corrugation peaks in FIG. 6B are too close to one another. Here, the plasma sheath 610B is not able to follow the surface of the extractor plate. As a result, the plasma sheath does not direct the ions through the apertures 602. Instead, the ions are much more likely to collide with some part of the extractor plate. As described above, ions are generally directed in a direction normal to the plasma sheath boundary. Where this plasma sheath boundary is not substantially parallel to the local surface of the extractor grid (and therefore is not substantially perpendicular to the direction of the aperture through the extractor plate), ions are not likely to pass through into the lower processing chamber, and the removal of unwanted material is likely be compromised.

In some embodiments, the distance between adjacent corrugation peaks within a segment of the ion extractor plate is at least about 2 mm, or at least about 5 mm. Further, the angle labeled in FIG. 6A as a, may be between about 1°-60°, for example between about 5°-45°. Other permissible angles are discussed further below.

In certain implementations, the ion extractor plate is corrugated over the entire area of the plate. In other words, the extractor plate may contain substantially no surface that is parallel to the substrate. In other implementations, the extractor plate may include corrugated and non-corrugated sections. In these embodiments, the corrugated part of the extractor plate may account for at least about 50%, or at least about 90% of the surface area of the plate, as projected onto a substrate-shaped plane (i.e., in calculating the percentage of corrugated area, the total area of the substrate ($A_t$) is considered to be $A_t = \pi \ast r^2$, where r is the radius of the extractor plate, and the corrugated area is considered to be the total area minus the flat, non-corrugated area).

The angle at which ions are directed into the lower processing chamber is dependent upon the angle of corrugation, labeled in FIGS. 6A and 6B as the angle α. In a particular embodiment, a varies between different parts of the corrugation to achieve different angles of ion incidence on the substrate. This results in a range of incident ion angles, making it more likely that a sufficient number of ions are able to penetrate into the etched features to remove the material on the sidewalls of such features. The incident ion angle is defined as the angle between the ion's incoming trajectory and the direction normal to the overall substrate surface. Where the ions leaving the extractor plate are very collimated, the angle of corrugation is equal to the angle of incidence. Where the ions leaving the extractor plate are less collimated and more spray-like, the range of incident ion angles achieved will be centered around the angle of corrugation. For the sake of simplicity, the incident ion angle is defined in relation to the overall substrate surface (unless it is clear otherwise), even though it is understood that a certain amount of ions will penetrate into a trench or other feature on the substrate and impact a surface which is oriented very differently from the overall substrate surface.

The angle of corrugation should be chosen in conjunction with the scale of corrugation and position of the apertures, such that ions which pass through the extractor plate do not end up colliding with a bottom surface of the extractor plate. In FIG. 6B, for example, because the scale of corrugation $L_B$ is too small, the few ions which are able to pass through an aperture in the extractor plate (if any) would likely collide with the bottom surface of the plate, as shown by the dotted arrow. This result should be avoided. In certain embodiments, the angle of corrugation is between about 0-75°, or between about 1-75°, or between about 0-60°, or between about 1-60°, or between about 30-55°. In these or other implementations, the angle of corrugation may be about 60° or lower, for example about 45° or lower, or about 15° or lower. In one particular embodiment, a corrugation angle of about 45° is used. As mentioned elsewhere herein, in certain embodiments, a range of different corrugation angles are used for a single ion extractor plate. In this case, the difference between the smallest and largest angle of corrugation may be at least about 10°, for example at least about 20°, at least about 30°, at least about 50°, or in some cases even higher.

The ion extractor plate is typically made from a conductive material. Examples of suitable plate materials include, but are not limited to, Al, W, Co, Mo, low resistivity silicon, and low resistivity SiC. As mentioned above, the plate should be constructed from a material that is sufficiently rigid.

The extractor plate generally spans nearly the entire horizontal section of the chamber, as shown in FIG. 1. As mentioned, in some designs, there is a gap between the extractor plate and the chamber walls to prevent arcing. The gap should be about 3 cm or greater. Where the chamber is circular (as viewed from above or facing the work piece), the plate will also be circular. This allows the grid to effectively divide the reaction chamber into two sub-chambers. In certain designs, the shape of the extractor plate is defined by the geometry of the substrate (which is typically but not necessarily a circular wafer). As is well known, wafers are often provided in various sizes, such as 200 mm, 300 mm, 450 mm, etc. Other shapes are possible for square or other polygonal substrates or smaller/larger substrates. Thus, the cross-section of the grid (as viewed from above) may have a variety of shapes and sizes.

In some implementations, the extractor plate has a region such as a central region containing a feature for allowing a probing apparatus to be disposed through the grid. The probing apparatus can be provided to probe process parameters associated with the plasma processing system during operation. Probing processes can include optical emission endpoint detection, interferometeric endpoint detection, plasma density measurements, ion density measurements, and other metric probing operations. In certain embodiments, the central region of the plate is open. In other embodiments, the central region of the plate contains an optically clear material (e.g., quartz, sapphire, etc.) to allow light to be transmitted through the plate.

In some embodiments, the extractor plate may include cooling channels embedded in the plate, and these cooling channels may be filled with a flowing or non-flowing coolant material. In certain embodiments, the cooling material is a fluid such as helium or other inert gas or a liquid such as deionized (DI) water, process cooling water, Fluoroinert™ from 3M, or a refrigerant such as perfluorocarbons, hydrofluorocarbons, ammonia and $CO_2$. In these or other embodiments, the extractor plate may include embedded heating elements and/or a temperature measurement device. The cooling channels and embedded heaters allow for precise temperature control, which permit close control over the particle and wall conditions. This control may be used to tune the conditions in the lower sub-chamber, in certain cases. For example, where the lower grid or grid assembly is maintained at a cooler temperature, etch byproducts from the wafer will preferentially deposit on the lower grid, thereby reducing the gas phase density of the etch byproducts in the lower sub-chamber. Alternatively, the lower grid or grid assembly may be maintained at an elevated temperature (e.g., above 80° C.) to reduce the deposition on the grid and ensure that the chamber can remain relatively clean and/or reduce the time required to clean the chamber during waferless auto clean (WAC).

Biasing the Ion Extractor Plate and Substrate Support

The ion extractor plate includes an electrical connection with a power supply. These elements may be used to apply a bias on the extractor plate during processing. In various implementations, the ion extractor plate is electrically connected with the substrate support through flexible RF straps. Because of the presence of these RF straps, the substrate support (and therefore the substrate) may be biased to the same RF potential as the ion extractor plate. By biasing these elements to the same potential, the likelihood of forming a plasma in the lower processing chamber is reduced.

One reason for biasing the extractor plate is to provide the ions leaving the plate with a particular energy level. In this way, the bias may be controlled to provide particular ion energies for the ions striking the substrate.

The bias will typically be an RF bias with a negative DC offset. This negative bias helps accelerate positive ions toward and through the extractor plate. In certain implementations, a low frequency bias (e.g., about 15 MHz or less, or about 4 MHz or less) is applied on the substrate and extractor plate. This relatively low bias frequency may be beneficial in ensuring that the inductance in the RF straps is small (e.g., about 50V or less). In these or other embodiments, the bias applied to the extractor plate may have a negative DC base of about 50-750 V. In one embodiment, bias frequency of 400 kHz is used. In one embodiment, multiple steps are used with different bias voltages applied to the extractor plate at each step. Alternatively, applied bias voltage may be pulsed between a setpoint and off state, or between 2 non-zero setpoints. This technique may be especially beneficial where substantial substrate charging takes place. In some applications, the bias voltage is turned off such that only low energy ions (e.g., <50V) are incident upon the substrate. Conditions in the Lower Processing Chamber In many embodiments, the lower processing chamber is substantially free of plasma during processing such that the ion trajectory out of the extractor holes is maintained in the space between the extractor plate and the substrate. Presence of plasma in this space would results in ions predominantly hitting the substrate at normal angles.

The pressure in the lower processing chamber may be relatively low in some embodiments (e.g., below about 20 mTorr, or below about 5 mTorr). Generally, the pressure in the lower processing chamber will be less than the pressure in the upper plasma generation chamber, at least in part due to a limitation on the conductance of mass through the extractor plate. One way to achieve the low pressure is by using a high pumping speed on a vacuum pump connected with the reaction chamber. This low pressure helps ensure that ions extracted from the plasma by the extractor plate can impinge on the substrate without many ion-gas collisions above the substrate. Ions which collide with gas molecules before reaching the substrate may be less useful for processing and removing material.

The substrate temperature may be controlled using electrostatic clamping and backside He gas to allow efficient thermal conduction between the ESC and the substrate. It may be advantageous to set temperatures above about 80° C. when using a combination of ions and reactive chemistry to remove materials from sidewalls of the features. When using ions alone, it may be useful to control the substrate temperature between about 20-60° C.

Apparatus

The methods described herein may be performed by any suitable plasma etching apparatus having a corrugated ion extractor plate. A suitable apparatus includes a chamber and electronic hardware for providing and maintaining etching conditions as described herein. A suitable apparatus may also include a system controller having instructions for controlling process operations in accordance with the present invention. In some embodiments, the plasma etching apparatus may be included as a process station in a larger process tool having various other processing stations.

Figure 7:
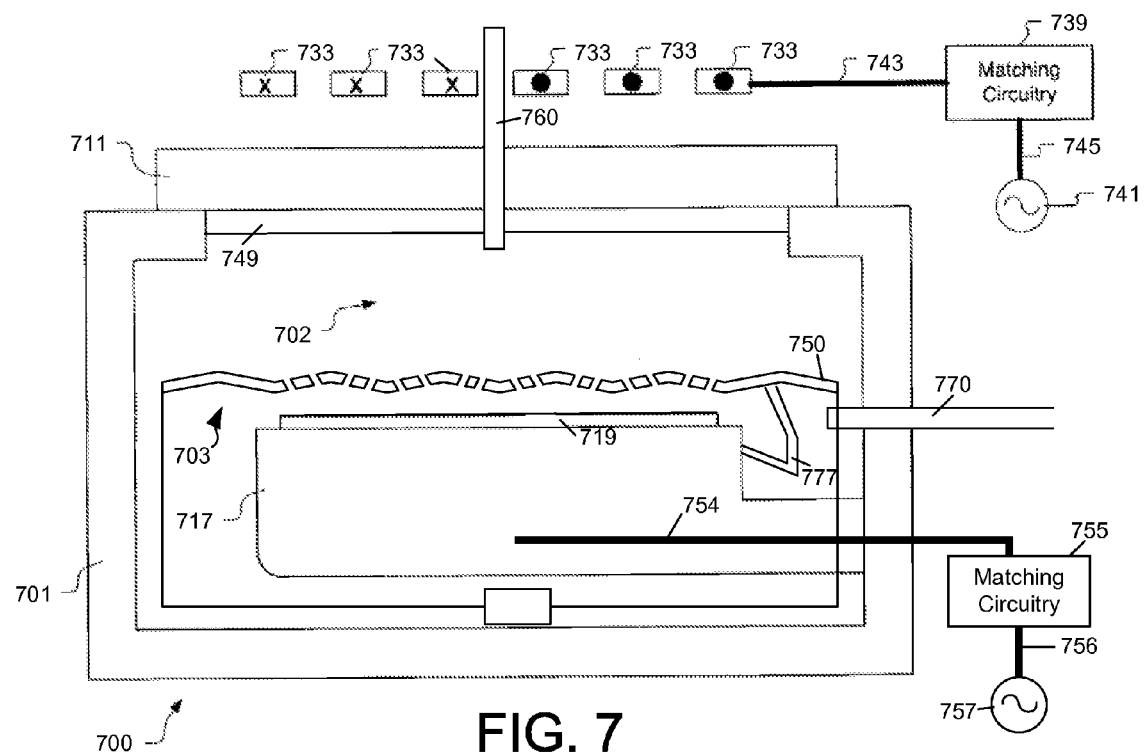
FIG. 7 shows an angled plasma etching reactor according to certain disclosed embodiments.

FIG. 7 provides a cross-sectional view of an inductively coupled plasma etching apparatus 700 in accordance with certain embodiments. As mentioned previously, the embodiments herein may be practiced with non-inductively coupled plasmas, as well. The inductively coupled plasma etching apparatus 700 includes an overall etching chamber structurally defined by chamber walls 701 and a window 711. The chamber walls 701 are typically fabricated from stainless steel or aluminum or anodized aluminum. The chamber walls may be coated with $Y_2O_3$, YF, $CeO_2$ or other plasma resistant coatings. The window 711 is typically fabricated from quartz or other dielectric materials such as $Al_2O_3$, AlN.

An ion extractor plate 750 divides the overall etching chamber into an upper plasma generation chamber 702 and a lower processing chamber 703. The substrate support 717 is electrically connected with a power supply 757 through connection 754, matching circuitry 755 and connection 756. The extractor plate is also electrically connected with the substrate support 717 through flexible RF straps 777. The power supply 757 supplies the appropriate bias to the extractor plate 750 and substrate support 717. During processing, there is generally a plasma present in the upper plasma generation chamber 702, while substantially no plasma is present in the lower processing chamber 703. A sealing mechanism (not shown) may be used proximate the periphery of the extractor plate to help prevent leakage of plasma into the lower processing chamber 703.

The extractor plate 750 may move through rotation or translation. In the embodiment of FIG. 7, the movement causing element(s) are not shown. In some cases, such as the embodiment shown in FIG. 1, the movement causing element is a rotational actuator 115 connected with the ion extractor plate 107 by supports 111. It may be beneficial for the movement causing elements to be positioned below the ion extractor grid such that they are protected from the plasma environment, where they would likely degrade more rapidly. In some other cases, the movement causing element is positioned in substantially the same plane as the extractor plate, or even above the extractor plate. Other potential movement causing elements include belts, gears, lifting mechanisms, etc. Any movement causing element which causes the plate to move in a way that increases the area/angular space over which the ions are contacting the local surface of the substrate may be used.

A chuck 717 is positioned within the lower processing chamber 703 near the bottom inner surface. The chuck 717 is configured to receive and hold a semiconductor wafer 719 upon which the etching process is performed. The chuck 717 can be an electrostatic chuck for supporting the wafer when present. In some embodiments, an edge ring (not shown) surrounds the chuck 717, and has an upper surface that is approximately planar with a top surface of a wafer, when present over chuck 717. The chuck 717 also includes electrostatic electrodes to enable the chucking and dechucking of the wafer. A filter and a DC clamp power supply may be provided for this purpose. Other control systems for lifting the wafer off of the chuck 717 can also be provided.

A coil 733 is positioned above the window 711. The coil 733 is fabricated from an electrically conductive material and includes at least one complete turn. The exemplary coil 733 shown in FIG. 7 includes three turns. The cross-sections of coil 733 symbols having an "X" indicate that the coil 733 extends rotationally into the page. Conversely, the coil 733 symbols having a "●" indicate that the coil 733 extends rotationally out of the page. An RF power supply 741 is configured to supply RF power to the coil 733. In general, the RF power supply 741 is connected to matching circuitry 739 through a connection 745. The matching circuitry 739 is connected to the coil 733 through a connection 743. In this manner, the RF power supply 741 is connected to the coil 733. An optional Faraday shield 749 is positioned just below the window 711. The Faraday shield may prevent metal or other species from depositing on the dielectric window of the plasma chamber. The Faraday shield is further discussed and described in U.S. patent application Ser. No. 13/198,683, filed Aug. 4, 2011, and titled "INTERNAL FARADAY SHIELD HAVING DISTRIBUTED CHEVRON PATTERNS AND CORRELATED POSITIONING RELATIVE TO EXTERNAL INNER AND OUTER TCP COIL," which is incorporated by reference herein in its entirety.

Process gases may be supplied through a main injection port 760 positioned in the upper plasma generation chamber and optionally through a side injection port 770, sometimes referred to as an STG. In various embodiments, an etchant gas is supplied through the side injection port 770, while the gas used to generate the plasma is injected through the main injection port 760. Gas exhaust ports are not shown. Also not shown are pumps connected to the chamber 701 to enable vacuum control and removal of gaseous byproducts from the chamber during operational plasma processing.

Radiofrequency power is applied from the RF power supply 741 to the coil 733 to cause an RF current to flow through the coil 733. The RF current flowing through the coil 733 generates an electromagnetic field about the coil 733. The electromagnetic field generates an inductive current within the upper plasma generation chamber 702. The inductive current acts on the gas present in the plasma generation chamber 702 to generate a plasma in therein. The ion extractor plate 750 limits the amount of plasma species that are able to migrate into the lower processing chamber 703, and specifically operates to provide ions to the lower processing chamber 703 at an angled orientation.

The physical and chemical interactions of the various ions and other species with the wafer 719 selectively etch features of the wafer. Etching byproducts may be removed from the lower processing chamber 703 through an exhaust port (not shown). One further benefit of the ion extractor plate 750 is that it helps shield etching byproducts from the plasma environment of the upper plasma generation chamber 702, making certain etch byproducts (especially metal-ligand complexes, when present) less likely to dissociate into non-volatile dissociation products which may otherwise redeposit on the substrate 719 or apparatus 700.

Typically, the chuck disclosed herein operates at elevated temperatures ranging between about 20° Celsius and about 250° Celsius, preferably between about 20-150° Celsius. The temperature will depend on the etching process operation and the specific recipe being used.

Although not shown, chamber 701 is typically coupled to facilities when installed in a clean room or a fabrication facility. Facilities include plumbing that provide processing gases, vacuum, temperature control, and environmental particle control. These facilities are coupled to chamber 701 when installed in the target fabrication facility. Additionally, chamber 701 may be coupled to a transfer chamber that will enable robotics to transfer semiconductor wafers into and out of chamber 701 using typical automation.

In one embodiment, the ion extractor plate 750 is removable, and the chamber 701 is configured to perform both a vertically oriented etching process (when the corrugated extractor plate 750 is removed) and the disclosed angled etching process (when the corrugated extractor plate 750 is present). In some cases, a non-corrugated ion extractor plate having a plurality of apertures may be used during the vertically oriented etching process. This non-corrugated plate helps provide ions for anisotropically etching feature in a substantially vertical direction. The teachings herein regarding the design of the corrugated ion extractor plate also apply to the non-corrugated extractor plate, other than teachings specifically regarding the corrugation features.

System Controller

In some embodiments, a system controller (which may include one or more physical or logical controllers) controls some or all of the operations of a process tool. The system controller will typically include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing, mixture of process gas components (e.g., the composition of the plasma generating gas and the composition of the etchant gas, where applicable), chamber pressure, chamber temperature, wafer temperature, current and potential applied to the chuck/wafer/ion extractor plate and any other electrodes, wafer position, extractor grid position, and other parameters of a particular process performed by the process tool. System control software may be configured in any suitable way. For example, various process tool component subroutines or control objects may be written to control operation of the process tool components necessary to carry out various process tool processes. System control software may be coded in any suitable computer readable programming language.

In some embodiments, system control software includes input/output control (IOC) sequence instructions for controlling the various parameters described above. For example, each phase of an etching process may include one or more instructions for execution by the system controller. The instructions for setting process conditions for a plasma generation process phase may be included in a corresponding plasma generation recipe phase. In some embodiments, the etching recipe phases may be sequentially arranged, so that all instructions for an etching process phase are executed concurrently with that process phase.

Other computer software and/or programs may be employed in some embodiments. Examples of programs or sections of programs for this purpose include a substrate positioning program, a plasma gas composition control program, an etching gas composition control program, a gas inlet timing control program, an ion extractor plate bias control program, an ion extractor plate position control program, an electrostatic chuck bias control program, a pressure control program, a heater control program, and a potential/current power supply control program. Any of the software/programs mentioned herein may contain instructions for modifying the relevant parameters during etching. In one example, an ion extractor plate bias control program may contain instructions to apply and optionally modify the bias applied to the extractor plate and electrostatic chuck during etching. As a consequence, the ion energy of the ions traveling into the lower processing chamber may be modified during the etch process.

In some cases, the controllers control one or more of the following functions: delivery of plasma generation gas to the upper plasma generation chamber, delivery of etchant gas to the lower processing chamber, plasma generation conditions in the plasma generation chamber, the bias applied to the ion extractor plate, etc. For example, the delivery of gas to the sub-chambers may be achieved by directing certain valves to open and close at particular times. This allows the controller to control both the timing of gas delivery, as well as the composition of the delivered gases. The controller may control plasma generation conditions by, for example, directing a power supply to provide power to a plasma generator (e.g., the coils of an ICP reactor) at particular frequencies/power levels. Further, the controller may control the plasma generation conditions by directing a flow of inert gas (and/or in some embodiments reactive gas) to enter the plasma generation chamber, or by controlling the pressure in the sub-chambers, or by controlling the temperature in the sub-chambers, etc. The controllers may control these aspects based on sensor output (e.g., when current, current density, potential, pressure, etc. reach a certain threshold), the timing of an operation (e.g., opening valves at certain times in a process) or based on received instructions from a user.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of removing material from sidewalls of features in partially fabricated semiconductor device structures, comprising:
   (a) receiving a substrate in a reaction chamber, wherein the reaction chamber is divided into a plasma generation sub-chamber and a processing sub-chamber by an ion extractor plate, wherein at least a portion of the ion extractor plate is corrugated, and wherein the ion extractor plate comprises apertures designed or configured to permit the passage of ions therethrough;
   (b) flowing a plasma generating gas into and generating a plasma in the plasma generation sub-chamber; and
   (c) accelerating ions from the plasma generation chamber, through the ion extractor plate, and into the processing volume toward the substrate to thereby remove material from feature sidewalls.

2. The method of claim 1, wherein the features of the semiconductor device structure comprise an etched insulating layer positioned between two etched conductive layers.

3. The method of claim 1, wherein at least some of the apertures have a central axis that is oriented at a non-perpendicular angle relative to the substrate.

4. The method of claim 1, wherein substantially no plasma is present in the processing sub-chamber during processing.

5. The method of claim 1, further comprising rotating the ion extractor plate during processing, but less than or equal to 360° in a single direction.

6. The method of claim 5, wherein the ion extractor plate comprises a plurality of distinct segment types, and wherein the ion extractor plate is rotated to an extent at which local parts of the substrate are exposed ions originating from each of the plurality of distinct segment types.

7. The method of claim 5, wherein the ion extractor plate is rotated clockwise and counter-clockwise while removing the material from feature sidewalls.

8. The method of claim 1, wherein the substrate holder is stationary during processing.

9. The method of claim 1, further comprising moving the ion extractor plate along an axis extending through the center of the extractor plate and substrate.

10. The method of claim 9, wherein moving the ion extractor plate along the axis extending through the center of the extractor plate and substrate occurs during an etching operation.

11. The method of claim 9, wherein moving the ion extractor plate along the axis extending through the center of the extractor plate and substrate occurs between etching steps in a multi-step etching process.

12. The method of claim 9 wherein moving the ion extractor plate along the axis extending through the center of the extractor plate and substrate occurs after processing the substrate and before processing a second substrate.

13. The method of claim 1, further comprising moving the ion extractor plate in a direction parallel to the substrate.

14. The method of claim 1, further comprising etching the features in the substrate prior to (a).

15. The method of claim 14, further comprising moving the substrate from an apparatus where the etching is performed to the reaction chamber prior to (a).

16. The method of claim 1, further comprising applying a bias to the ion extractor plate.

17. The method of claim 16, wherein the reaction chamber further comprises RF straps connecting the ion extractor plate with a substrate support used to support the substrate in the reaction chamber, the RF straps designed or configured to provide a bias on the substrate support that corresponds to the bias applied to the ion extractor plate.

18. The method of claim 1, wherein the apertures are designed or configured to direct the passage of ions therethrough at a plurality of angles with respect to the substrate.

19. The method of claim 1, wherein the features comprise trenches and/or holes.

20. The method of claim 1, wherein the features comprise pillars.

* * * * *